United States Patent
Fujiyoshi et al.

(10) Patent No.: US 8,586,399 B2
(45) Date of Patent: Nov. 19, 2013

(54) DETECTION DEVICE MANUFACTURING METHOD USING IMPURITY SEMICONDUCTOR LAYER IN ARRAYED PIXELS

(75) Inventors: Kentaro Fujiyoshi, Kumagaya (JP); Chiori Mochizuki, Sagamihara (JP); Minoru Watanabe, Honjo (JP); Masato Ofuji, Honjo (JP); Keigo Yokoyama, Honjo (JP); Jun Kawanabe, Kodama-gun (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/477,401

(22) Filed: May 22, 2012

(65) Prior Publication Data

US 2012/0306041 A1  Dec. 6, 2012

(30) Foreign Application Priority Data

May 31, 2011  (JP) .................................. 2011-122015
Apr. 10, 2012  (JP) .................................. 2012-089550

(51) Int. Cl.
*H01L 21/00* (2006.01)
(52) U.S. Cl.
USPC .................................... 438/73; 257/E31.126

(58) Field of Classification Search
USPC .............................. 438/73, 98; 257/E31.126
See application file for complete search history.

(56) References Cited

U.S. PATENT DOCUMENTS

2009/0127435 A1*  5/2009  Mochizuki et al. ........ 250/208.1

FOREIGN PATENT DOCUMENTS

WO      2007/001357 A2      1/2007

* cited by examiner

*Primary Examiner* — Bilkis Jahan
(74) *Attorney, Agent, or Firm* — Canon U.S.A., Inc IP Division

(57) ABSTRACT

In a method of manufacturing a detection device including pixels on a substrate, each pixel including a switch element and a conversion element including an impurity semiconductor layer on an electrode, which is disposed above the switch element and isolated per pixel, the switch element and the electrode being connected in a contact hole formed in a protection layer and an interlayer insulating layer, which are disposed between the switch elements and the electrodes, the method includes forming insulating members over the interlayer insulating layer between the electrodes in contact with the interlayer insulating layer, forming an impurity semiconductor film covering the insulating members and the electrodes, and forming a coating layer covering an area of the protection layer where an orthographically-projected image of a portion of the electrode is positioned, the portion including a level difference within the contact hole.

18 Claims, 26 Drawing Sheets

FIG. 2G
FIG. 2H
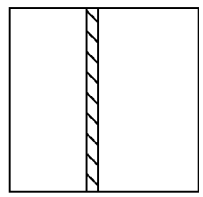
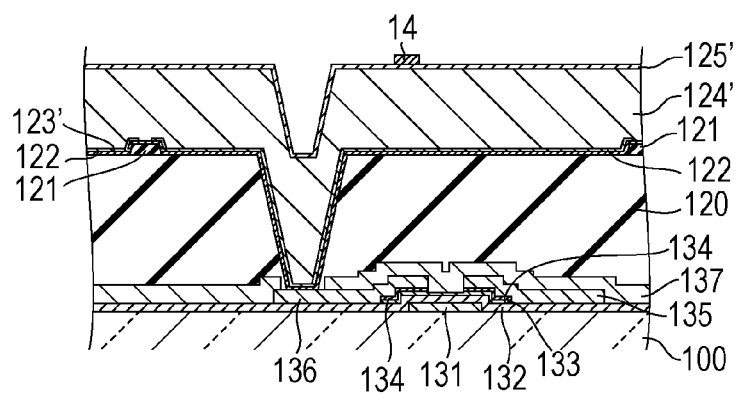
FIG. 2I
FIG. 2J
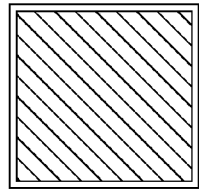
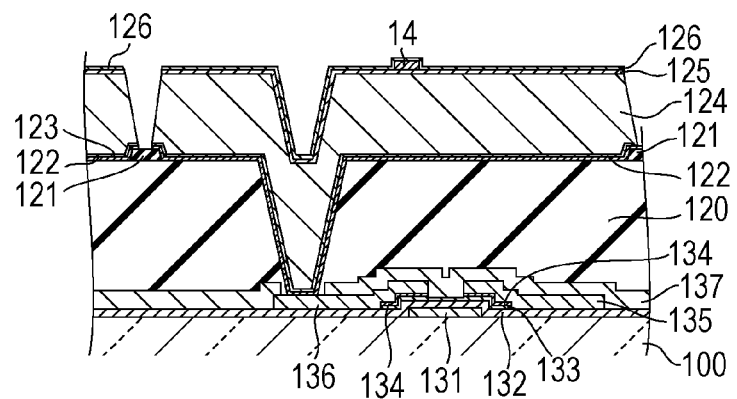

FIG. 7A
FIG. 7B
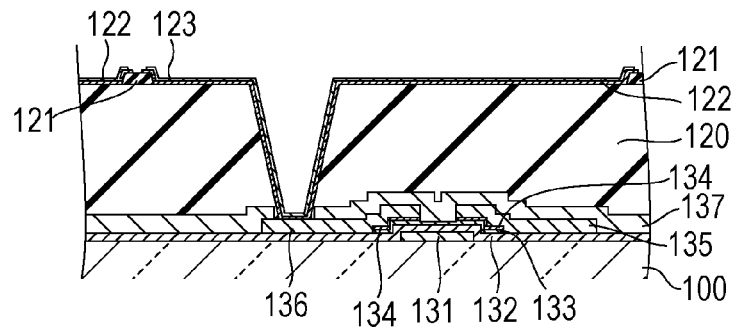
FIG. 7C
FIG. 7D
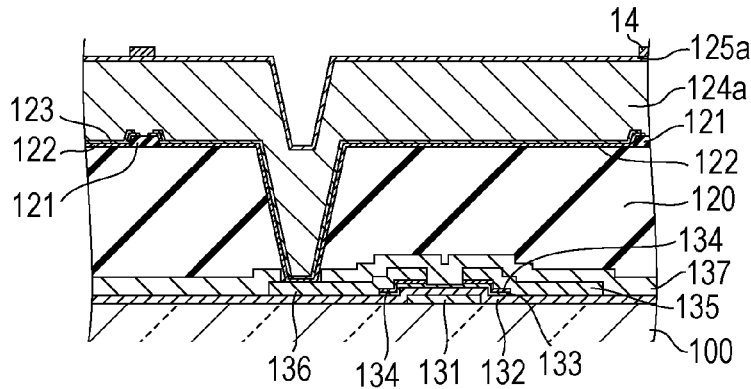

FIG. 10A
FIG. 10B
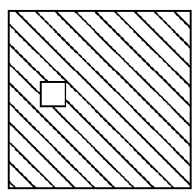
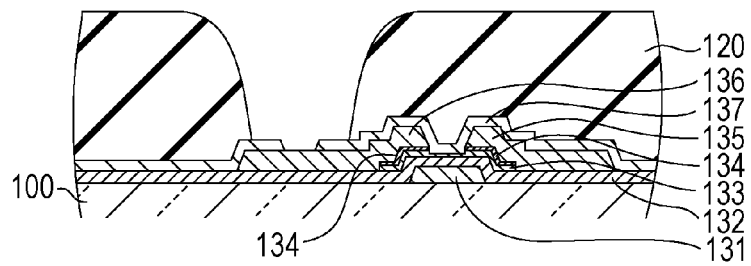
FIG. 10C
FIG. 10D
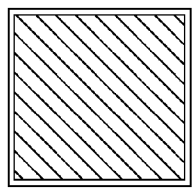
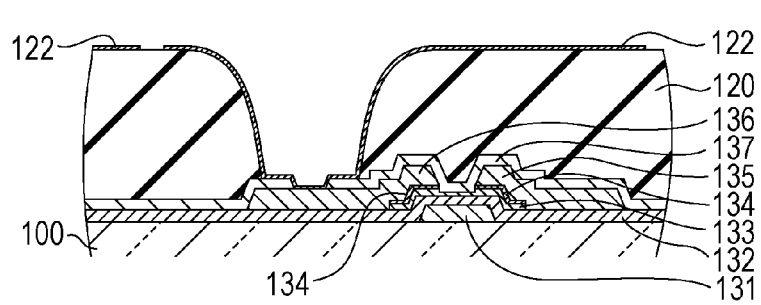
FIG. 10E
FIG. 10F
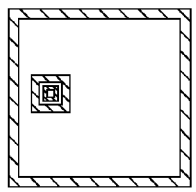
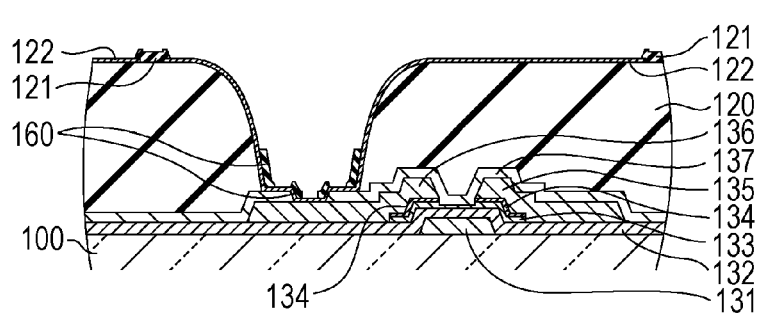

FIG. 14E
FIG. 14F
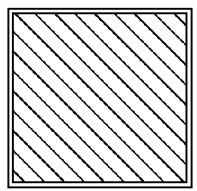
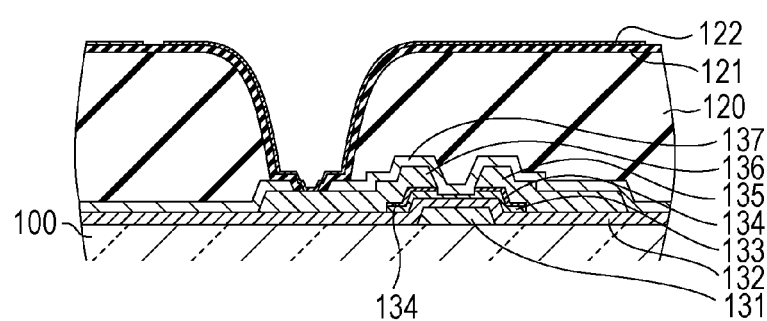
FIG. 14G
FIG. 14H
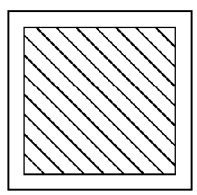
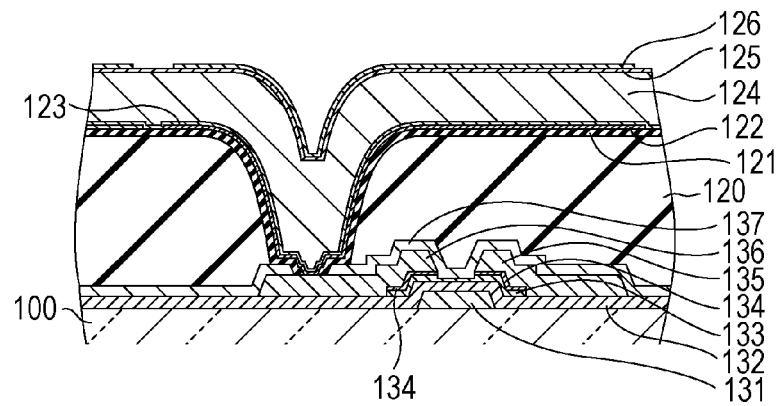

FIG. 16A
FIG. 16B
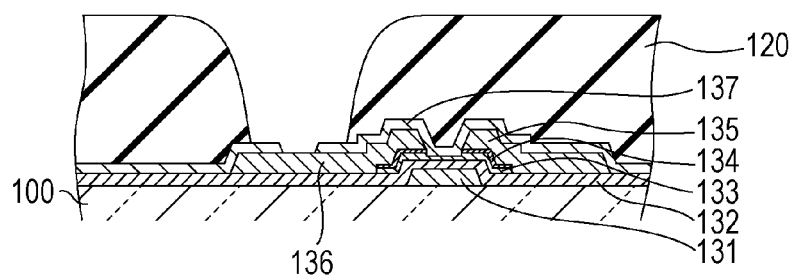
FIG. 16C
FIG. 16D
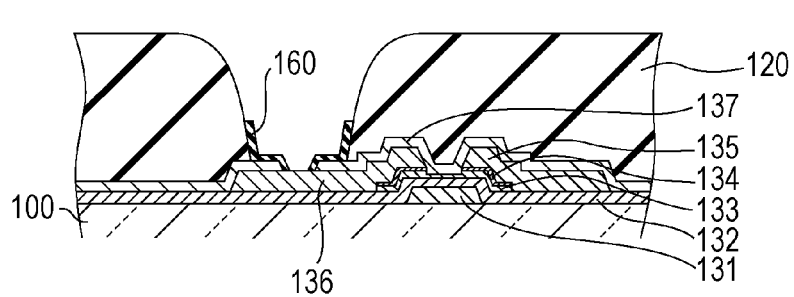

FIG. 16E
FIG. 16F
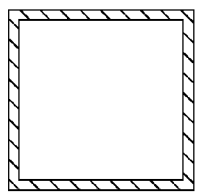
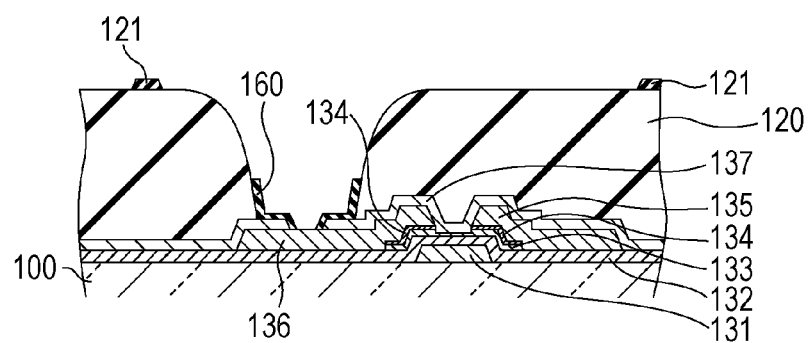
FIG. 16G
FIG. 16H
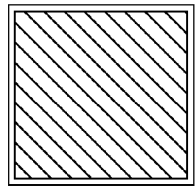
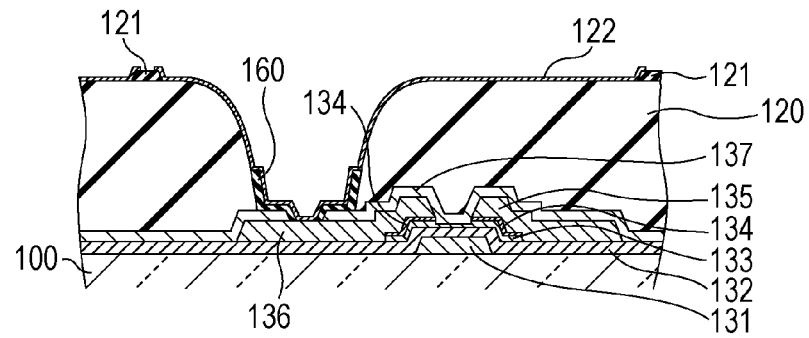

DETECTION DEVICE MANUFACTURING METHOD USING IMPURITY SEMICONDUCTOR LAYER IN ARRAYED PIXELS

BACKGROUND OF THE INVENTION

1. Field of the Invention

One disclosed aspect of the embodiments relates to a method of manufacturing a detection device that is applied to, e.g., a medical imaging diagnostic apparatus, a nondestructive inspection apparatus, and an analyzing apparatus using radiation. The disclosure further relates to the detection device and a detection system.

2. Description of the Related Art

Recently, the thin-film semiconductor manufacturing technique has been utilized in the field of detection devices of the type including a pixel array in which switch elements, e.g., TFTs (thin film transistors), and conversion elements, e.g., photodiodes, for converting radiation or light to electric charges are combined with each other.

A related-art detection device disclosed in International Publication WO2007/01357 includes conversion elements disposed on electrodes, which are arrayed on a substrate, are isolated for each of pixels, and are made of a transparent conductive oxide. The related-art detection device further includes switch elements connected to the electrodes through contact holes formed in an interlayer insulating layer, which is disposed between the substrate and the electrodes and which is made of an organic material. Impurity semiconductor layers and semiconductor layers of the conversion elements are partly removed on the interlayer insulating layer such that the conversion elements are isolated per pixel.

In trying to manufacture the detection device disclosed in International Publication WO2007/01357, however, a manufacturing method includes an operation where the interlayer insulating layer is brought into an exposed state when an impurity semiconductor film becoming an impurity semiconductor layer of the conversion element later is formed. In some cases, therefore, the surface of the interlayer insulating layer is exposed when the impurity semiconductor film is formed. Accordingly, an organic material of the interlayer insulating layer may be partly scattered and mixed into the impurity semiconductor layer depending on the type of film forming process. This raises the problem that the impurity semiconductor layer of the conversion element is organically contaminated, and that defects in the impurity semiconductor layer and defects at the interface between the impurity semiconductor layer and the semiconductor layer are increased, whereby a dark current in the conversion element is increased.

SUMMARY OF THE INVENTION

With the view of solving the problem described above, an embodiment provides a detection device that can reduce mixing of an organic material into an impurity semiconductor layer of a conversion element.

According to one embodiment, there is provided a method of manufacturing a detection device including a plurality of pixels arrayed on a substrate, the pixels each including a switch element disposed on the substrate and a conversion element including an impurity semiconductor layer disposed on an electrode, which is disposed above the switch element and which is isolated per pixel, a protection layer made of an inorganic material, disposed between the substrate and the plurality of electrodes, and covering the plurality of switch elements, and an interlayer insulating layer made of an organic material and disposed over the protection layer, the switch element and the electrode being connected to each other in a contact hole that is formed in the protection layer and the interlayer insulating layer, the method including an operation of forming, on the interlayer insulating layer, the electrodes in contact with the interlayer insulating layer and insulating members each made of an inorganic material and disposed to cover the interlayer insulating layer between adjacent two of the electrodes, an operation of forming an impurity semiconductor film that covers the insulating members and the electrodes, and that becomes the impurity semiconductor layer, and an operation of forming a coating layer such that, when the insulating members are formed, the coating layer covers an area of the protection layer where an orthographically-projected image of a portion of the electrode is positioned, the portion including a level difference located within the contact hole of the interlayer insulating layer.

According to another embodiment, there is provided a detection device including a plurality of pixels arrayed on a substrate, the pixels each including a switch element disposed on the substrate and a conversion element including an impurity semiconductor layer disposed on an electrode, which is disposed above the switch element and which is isolated per pixel; a protection layer made of an inorganic material, disposed between the plurality of switch elements and the plurality of electrodes, and covering the plurality of switch elements; an interlayer insulating layer made of an organic material and covering the protection layer; a contact hole formed in the protection layer and in the interlayer insulating layer, the switch element and the electrode being connected to each other in the contact hole; insulating members each made of an inorganic material, disposed on the interlayer insulating layer to cover the interlayer insulating layer between adjacent two of the electrodes that are disposed on the interlayer insulating layer in contact with the interlayer insulating layer, the impurity semiconductor layer being formed by separating an impurity semiconductor film, which is formed over the insulating members and the electrodes, at a position above each of the insulating members; and a coating layer covering an area of the protection layer where an orthographically-projected image of a portion of the electrode is positioned, the portion including a level difference located within the contact hole of the interlayer insulating layer.

With the embodiment of the disclosure, the detection device capable of reducing mixing of the organic material into the impurity semiconductor layer of the conversion element may be obtained.

Further features of the disclosure will become apparent from the following description of exemplary embodiments with reference to the attached drawings.

BRIEF DESCRIPTION OF THE DRAWINGS

FIGS. 2A, 2C, 2E, 2G and 2I illustrate mask patterns to explain a method of manufacturing the detection device according to the first embodiment.

FIGS. 2B, 2D, 2F, 2H and 2J are sectional views to explain the method of manufacturing the detection device according to the first embodiment.

FIGS. 7A and 7C illustrate mask patterns to explain a method of manufacturing the detection device according to the third embodiment.

FIGS. 7B and 7D are sectional views to explain the method of manufacturing the detection device according to the third embodiment.

FIGS. 10A, 10C, 10E, 10G and 10I illustrate mask patterns to explain a method of manufacturing the detection device according to the fifth embodiment.

FIGS. 10B, 10D, 10F, 10H and 10J are sectional views to explain the method of manufacturing the detection device according to the fifth embodiment.

FIGS. 14A, 14C, 14E and 14G illustrate mask patterns to explain a method of manufacturing the detection device according to the sixth embodiment.

FIGS. 14B, 14D, 14F and 14H are sectional views to explain the method of manufacturing the detection device according to the sixth embodiment.

FIGS. 16A, 16C, 16E and 16G illustrate mask patterns to explain a method of manufacturing the detection device according to the seventh embodiment.

FIGS. 16B, 16D, 16F and 16H are sectional views to explain the method of manufacturing the detection device according to the seventh embodiment.

DESCRIPTION OF THE EMBODIMENTS

Embodiments of the disclosure will be described in detail below with reference to the attached drawings. It is to be noted that the term "radiation" used in this specification includes not only an $\alpha$-ray, a $\beta$-ray and a $\gamma$-ray which are beams formed by particles (including photons) emitted with radioactive decay, but also beams having comparable or more energy, such as an X-ray, a particle ray, and a cosmic ray.

First Embodiment

Figure 1A:
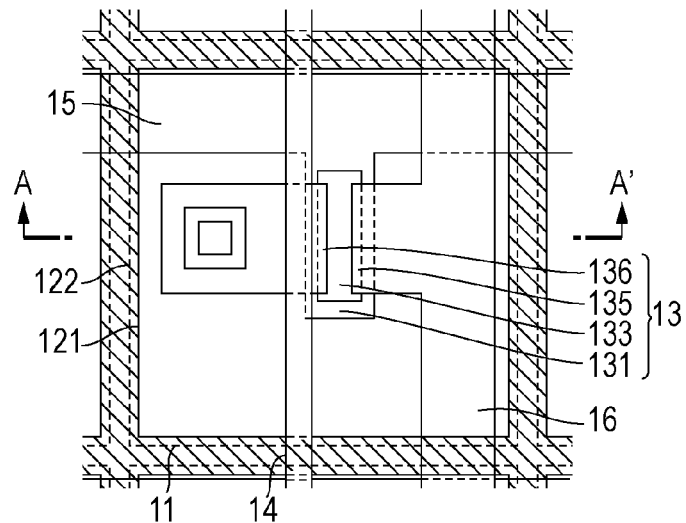
FIG. 1A is a plan view, per pixel, of a detection device according to a first embodiment.
Figure 1B:
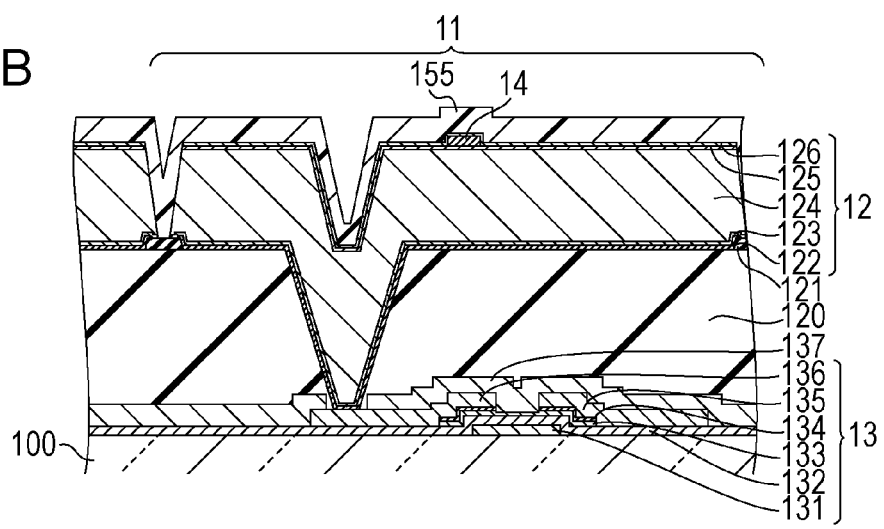
FIG. 1B is a sectional view taken along a line A-A' in FIG. 1A.
Figure 1C:
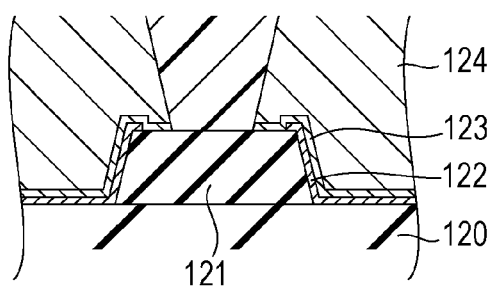
FIG. 1C is an enlarged view of a portion between pixels in FIG. 1A.

The structure of one pixel in a detection device according to a first embodiment is first described with reference to FIGS. 1A to 1C. FIG. 1A is a plan view per pixel. For the sake of simplicity, regarding a conversion element, only a first electrode is illustrated in FIG. 1A. FIG. 1B is a sectional view taken along a line A-A' in FIG. 1A, and FIG. 1C is an enlarged view of a pixel end portion (i.e., a portion between pixels).

One pixel 11 in the detection device according to the first embodiment includes a conversion element 12 for converting radiation or light to electric charges, and a TFT (thin film transistor) 13 that is a switch element for outputting an electric signal corresponding to the electric charges generated in the conversion element 12. The conversion element 12 is formed of a PIN-type photodiode. The conversion element 12 is stacked on the TFT 13, which is formed on an insulating substrate 100, e.g., a glass substrate, with an interlayer insulating layer 120 interposed between the conversion element 12 and the TFT 13.

The TFT 13 includes a control electrode 131, an insulating layer 132, a semiconductor layer 133, an impurity semiconductor layer 134 having a higher impurity concentration than the semiconductor layer 133, a first main electrode 135, and a second main electrode 136, which are formed on the substrate 100 in that order from the substrate side. Partial regions of the impurity semiconductor layer 134 are contacted respectively with the first main electrode 135 and the second main electrode 136, and a region between regions of the semiconductor layer 133, which are contacted with the partial regions of the impurity semiconductor layer 134, serves as a channel region of the TFT. The control electrode 131 is electrically connected to a control wiring 15. The first main electrode 135 is electrically connected to a signal wiring 16, and the second main electrode 136 is electrically connected to a first electrode 122 of the conversion element 12. In this embodiment, the first main electrode 135, the second main electrode 136, and the signal wiring 16 are integrally formed in the same conductive layer, and the first main electrode 135 functions as a part of the signal wiring 16. A protection layer 137 is disposed to cover the TFT 13, the control wiring 15, and the signal wiring 16. While, in this embodiment, an inverted-staggered TFT using the semiconductor layer 133 and the impurity semiconductor layer 134, which are each made of primarily amorphous silicon, is employed as the switch element, the disclosure is not limited to such an example. As other examples, a staggered TFT made of primarily polycrystalline silicon, an organic TFT, an oxide TFT, etc. may also be used.

The interlayer insulating layer 120 is disposed between the substrate 100 and the plurality of first electrodes 122, described in detail below, to cover the plurality of TFTs 113, and it has a contact hole. The first electrode 122 of the conversion element 12 and the second main electrode 136 of the TFT 13 are electrically connected to each other in the contact hole formed in the interlayer insulating layer 120.

The conversion element 12 includes the first electrode 122, an impurity semiconductor layer 123 of first conductivity type, a semiconductor layer 124, an impurity semiconductor layer 125 of second conductivity type, and a second electrode 126, which are formed on the interlayer insulating layer 120 in that order from the interlayer insulating layer side. Here, the impurity semiconductor layer 123 of first conductivity type exhibits polarity of first conductivity type and has a concentration of first conductivity type impurities higher than concentrations of the first conductivity type impurities in the semiconductor layer 124 and the impurity semiconductor layer 125 of second conductivity type. Also, the impurity semiconductor layer 125 of second conductivity type exhibits polarity of second conductivity type and has a concentration of second conductivity type impurities higher than concentrations of the second conductivity type impurities in the impurity semiconductor layer 123 of first conductivity type and the semiconductor layer 124. The first conductivity type and the second conductivity type imply conductivity types having different polarities from each other. For example, when the first conductivity type is n-type, the second conductivity type is p-type. An electrode wiring 14 is electrically connected to the second electrode 126 of the conversion element 12. The first electrode 122 of the conversion element 12 is electrically connected to the second main electrode 136 of the TFT 13 in the contact hole formed in the interlayer insulating layer 120. While this embodiment employs the photodiode using the impurity semiconductor layer 123 of first conductivity type, the semiconductor layer 124, and the impurity semiconductor layer 125 of second conductivity type, which are each made of primarily amorphous silicon, the disclosure is not limited to such an example. As another example, an element capable of directly converting radiation to electric charges may also be used in which the impurity semiconductor layer 123 of first conductivity type, the semiconductor layer 124, and the impurity semiconductor layer 125 of second conductivity type are each made of primarily amorphous selenium.

An insulating member 121 made of an inorganic material is disposed to cover the interlayer insulating layer 120 between adjacent two of the plural first electrodes 122 on the interlayer insulating layer 120. In other words, the first electrodes 122 and the insulating members 121 are disposed on the interlayer insulating layer 120 to cover the interlayer insulating layer 120. Therefore, when an impurity semiconductor film becoming the impurity semiconductor layer 123 is formed, the surface of the interlayer insulating layer 120 is not exposed and mixing of the organic material into the impurity semiconductor layer 123 may be reduced. Moreover, in this embodiment, the impurity semiconductor layer 123, the semiconductor layer 124, and the impurity semiconductor layer 125 are each separated per pixel above the insulating member 121. In a dry etching operation for separating each of those layers, the insulating member 121 acts as an etching stopper layer. Accordingly, the interlayer insulating layer 120 is not exposed to the species of the dry etching, and the surrounding layers may be avoided from being contaminated by the organic material.

To prevent the interlayer insulating layer from being exposed, it is conceivable to form an insulating layer made of an inorganic material over the interlayer insulating layer. In such a case, however, the electrode of the conversion element, the electrode being made of a transparent conductive oxide, is disposed on the insulating layer. The transparent conductive oxide is formed through polycrystallization after forming it in an amorphous state. Internal stress in the transparent conductive oxide is changed during the polycrystallization. Because the insulating layer made of the inorganic material is harder than the interlayer insulating layer made of the organic material and has higher binding energy, a problem may occur in that the insulating layer may not follow the change of the internal stress during the polycrystallization of the transparent conductive oxide and the electrode of the conversion element is peeled off from the insulating layer.

The first electrode 122 is made of a transparent conductive oxide, e.g., ITO. The transparent conductive oxide has such a feature that, in an amorphous state, it exhibits a much higher etching rate and higher pattern controllability than in a polycrystalline state. For that reason, the transparent conductive oxide is generally formed by a method of first etching a transparent conductive oxide formed in an amorphous state, and then polycrystallizing it in an annealing operation. Because internal stress in the transparent conductive oxide is changed in the annealing operation, the type of an underlying film in contact with the transparent conductive oxide is very important from the viewpoint of film adhesion. For example, when the transparent conductive oxide is disposed on an insulating layer made of an inorganic material having high surface hardness and high binding energy, the first electrode 122 may be peeled off because the insulating layer made of the inorganic material may not follow deformation caused by the change of the internal stress in the ITO. On the other hand, when the transparent conductive oxide is disposed on the interlayer insulating layer 120 made of an organic material having low surface hardness and low binding energy, the interlayer insulating layer 120 may follow deformation caused by the change of the internal stress in the transparent conductive oxide in a more adaptable way than the insulating layer made of the inorganic material. Also, with energy generated during the polycrystallization of the transparent conductive oxide, the binding of the organic material is caused to rejoin with the polycrystallized transparent conductive oxide, thus making the interlayer insulating layer 120 more adaptable for the stress change. As a result, the peeling-off of the first electrode 122 may be reduced. In this embodiment, since the first electrode 122 is disposed in a width of 70 to 180 μm and is contacted in its most part with the interlayer insulating layer 120, the peeling-off of the first electrode 122 may be reduced. In this embodiment, the first electrode 122 is disposed at its end of about 5 μm on the insulating member 121, and an adhesion force between the first electrode 122 and the insulating member 121 is low. However, since such an end width is much smaller than the width where the first electrode 122 is contacted with the interlayer insulating layer 120, the problem of the peeling-off of the first electrode 122 does not occur.

A passivation layer 155 is disposed to cover the conversion elements 12.

A method of manufacturing the detection device according to the first embodiment will be described below with reference to FIGS. 2A to 2J. In particular, operations subsequent to an operation of forming the contact hole in the interlayer insulating layer 120 are described in detail with reference to mask patterns and sectional views during a process. FIGS. 2A, 2C, 2E, 2G and 2I are schematic plan views of mask patterns of photomasks used in successive operations. FIGS. 2B, 2D, 2F, 2H and 2J are schematic sectional views, taken at a position corresponding to the line A-A' in FIG. 1A, in the successive operations.

In an initial state, the plurality of TFTs 13 are disposed on the insulating substrate 100, and the protection layer 137 made of an inorganic material is disposed over the plurality of TFTs 13. The contact hole is formed by etching in a portion of the protection layer 137 above the second main electrode 136 for electrical connection to the photodiode. In an operation illustrated in FIG. 2B, an acryl resin as an organic material having photosensitivity is formed as an interlayer insulating film to cover the TFTs 13 and the protection layer 137 by using a coating apparatus, e.g., a spinner. A polyimide resin, for example, may also be used as the organic material having photosensitivity. By using a mask illustrated in FIG. 2A, the interlayer insulating layer 120 having the contact hole is then formed through exposure and development.

Figure 2A:
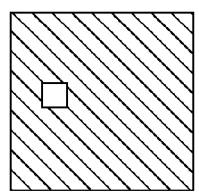
Figure 2B:
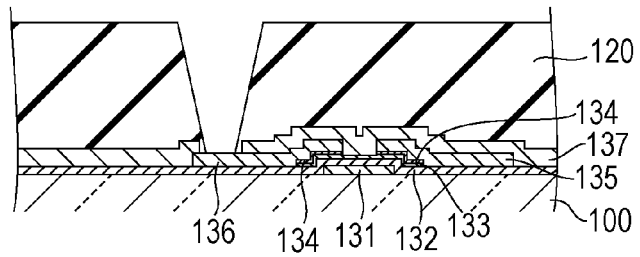
Figure 2C:
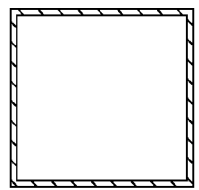
Figure 2D:
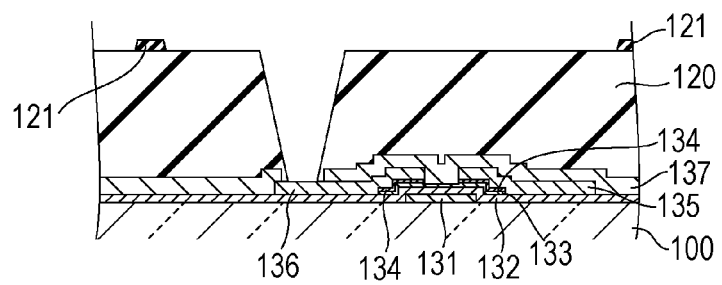
Figure 2E:
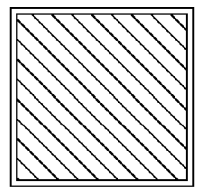

Next, in an operation illustrated in FIG. 2D, an insulating film made of a general inorganic material, e.g., a silicon nitride film or a silicon oxide film, is formed by plasma CVD to cover the interlayer insulating layer 120. The insulating member 121 is then formed between the pixels by etching the insulating film with the use of a mask illustrated in FIG. 2C.

Figure 2F:
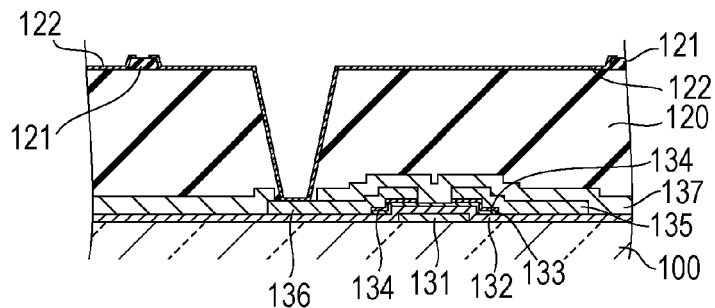

Next, in an operation illustrated in FIG. 2F, an amorphous transparent conductive oxide film made of ITO is formed by sputtering to cover the interlayer insulating layer 120 and the insulating members 121. The transparent conductive oxide film is subjected to wet etching by using a mask illustrated in FIG. 2E and then to annealing for polycrystallization, thereby forming the first electrode 122 of the conversion element. At that time, the surface of the interlayer insulating layer 120 is covered with the plurality of insulating members 121 and the plurality of first electrodes 122. With the polycrystallization, internal stress in the first electrode 122 is increased. However, because a most part of the first electrode 122 is formed in contact with the interlayer insulating layer 120, adhesion therebetween is held and the problem of peeling-off of the first electrode 122 is not caused. While ITO is used as the transparent conductive oxide in this embodiment, ZnO, $SnO_2$, ATO, AZO, $CdIn_2O_4$, $MgIn_2O_4$, $ZnGa_2O_4$, and $InGaZnO_4$ may also be beneficially used. Other transparent conductive oxides containing Cu and being able to take a delafossite-type amorphous state, e.g., $CuAlO_2$, are further beneficially usable.

Next, in an operation illustrated in FIG. 2H, an amorphous silicon film mixed with, as an impurity, a pentavalent element, e.g., phosphorus, is formed as an impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. When the impurity semiconductor film 123' is formed, the interlayer insulating layer 120 is exposed to plasma if the interlayer insulating layer 120 is not covered with the insulating members 121 and the first electrodes 122. If the interlayer insulating layer 120 made of the organic material is exposed to plasma, the organic material may be scattered and mixed into the impurity semiconductor film 123'. To cope with such a problem, in this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. Such a structure may prevent scattering of the organic material and mixing of the organic material into the impurity semiconductor film of first conductivity type. An electroconductive film made of Al, for example, which becomes the electrode wiring 14, is then formed by sputtering to cover the impurity semiconductor film 125'. Further, the electroconductive film is subjected to wet etching by using a mask illustrated in FIG. 2G, thereby forming the electrode wiring 14.

Next, in an operation illustrated in FIG. 2J, a transparent conductive oxide film is formed by sputtering to cover the impurity semiconductor film 125' and the electrode wiring 14. The transparent conductive oxide film is then subjected to wet etching by using a mask illustrated in FIG. 2I, thereby forming the second electrode 126 of the conversion element 12. Further, the conversion element 12 is isolated per pixel by partly removing the impurity semiconductor film 125', the semiconductor film 124', and the impurity semiconductor film 123' with dry etching using the same mask as that illustrated in FIG. 2I. The isolated conversion element 12 includes the impurity semiconductor layer 125, the semiconductor layer 124, and the impurity semiconductor layer 123 therein. The pixel isolation by the dry etching is performed above each of the insulating members 121. Therefore, each insulating member 121 functions as an etching stopper layer, and the interlayer insulating layer 120 is not exposed to the species of the dry etching. Thus, contamination of the surrounding layers by the organic material may be prevented. Further, the first electrode 122 is covered with the impurity semiconductor layer 123. Accordingly, the obtained structure does not include the so-called Schottky junction, i.e., direct junction between the first electrode 122 and the semiconductor layer 124. While, in this embodiment, the transparent conductive oxide is used as the material of the second electrode 126, the disclosure is not limited to such an example as long as an electroconductive film is used. As another example, when an element directly converting radiation to electric charges is used as the conversion element 12, an electroconductive film made of, e.g., Al, through which radiation is able to easily pass, may be used as the second electrode 126.

Then, the passivation layer 155 is formed to cover the conversion elements 12 and the insulating members 121, whereby the structure illustrated in FIG. 1B is obtained. When the passivation layer 155 is formed, the interlayer insulating layer 120 is not exposed and contamination of the surrounding layers by the organic material may be prevented.

Figure 3:
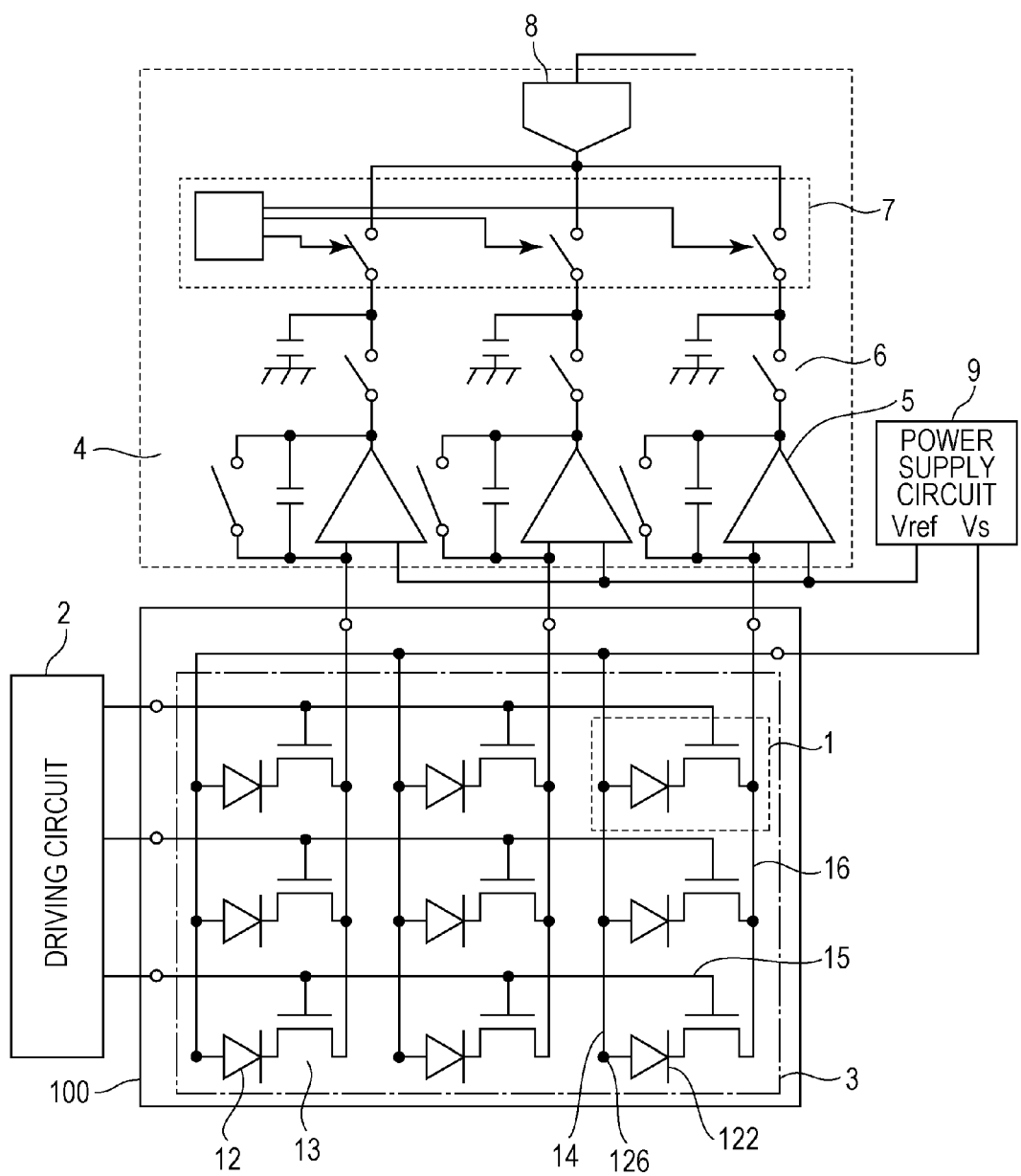
FIG. 3 is an equivalent circuit diagram of the detection device according to the first embodiment.

A schematic equivalent circuit of the detection device according to the first embodiment will be described below with reference to FIG. 3. While FIG. 3 is an equivalent circuit diagram of 3 rows and 3 columns for the sake of simplifying the explanation, the disclosure is not limited to such an example, and the detection device has a pixel array of n rows and m columns (n, m: natural number equal to or more than 2). In the detection device according to this embodiment, a conversion section 3 including a plurality of pixels 1 arrayed in the row direction and the column direction is disposed on the surface of the substrate 100. Each pixel 1 includes the conversion element 12 for converting radiation or light to electric charges, and the TFT 13 for outputting an electric signal corresponding to the electric charges generated in the conversion element 12. A scintillator (not illustrated) for converting radiation to visible light through wavelength conversion may be disposed on the surface of the conversion element 12 on the side including the second electrode 126. Each electrode wiring 14 is connected in common to the second electrodes 126 of the plurality of conversion elements 12 arrayed in the column direction. Each control wiring 15 is connected in common to the control electrodes 131 of the plurality of TFTs 13 arrayed in the row direction, and it is further electrically connected to a driving circuit 2. The driving circuit 2 successively or simultaneously supplies driving pulses to the plurality of control wirings 15 arrayed in the column direction, whereby the electric signals from the pixels are output in parallel in units of row to the plurality of signal wirings 16 arrayed in the row direction. Each signal wiring 16 is connected in common to the first main electrodes 135 of the plurality of TFTs 13 arrayed in the column direction, and it is further electrically connected a read circuit 4. The read circuit 4 includes, per signal wiring 16, an integrating amplifier 5 for integrating and amplifying an electric signal from the signal wiring 16, and a sample and hold circuit 6 for sampling and holding the electric signal that has been amplified by and output from the integrating amplifier 5. The read circuit 4 further includes a multiplexer 7 for converting the electric signals output in parallel from the plurality of sample and hold circuits 6 to a serial electric signal, and an A/D converter 8 for converting the output electric signal to digital data. A reference potential Vref is supplied from a power supply circuit 9 to a non-inverting input terminal of the integrating amplifier 5. Further, the power supply circuit 9 is electrically connected to the plurality of electrode wirings 14 arrayed in the row direction, thus supplying a bias potential Vs to the second electrodes 126 of the conversion elements 12.

The operation of the detection device according to this embodiment will be described below. The reference potential Vref is applied to the first electrode 122 of each conversion element 12 through the TFT 13, and the bias potential Vs for separating electron-hole pairs generated by radiation or visible light is applied to the second electrode 126. In that state, when radiation having passed through a specimen or visible light corresponding to the radiation enters the conversion element 12, it is converted to electric charges, which are accumulated in the conversion element 12. The electric signal corresponding to the accumulated electric charges is output to the signal wiring 16 when the TFT 13 is brought into a conductive state by the driving pulse that is applied to the control wiring 15 from the driving circuit 2. The electric signal is then read as digital data to the outside by the read circuit 4.

Second Embodiment

Figure 4A:
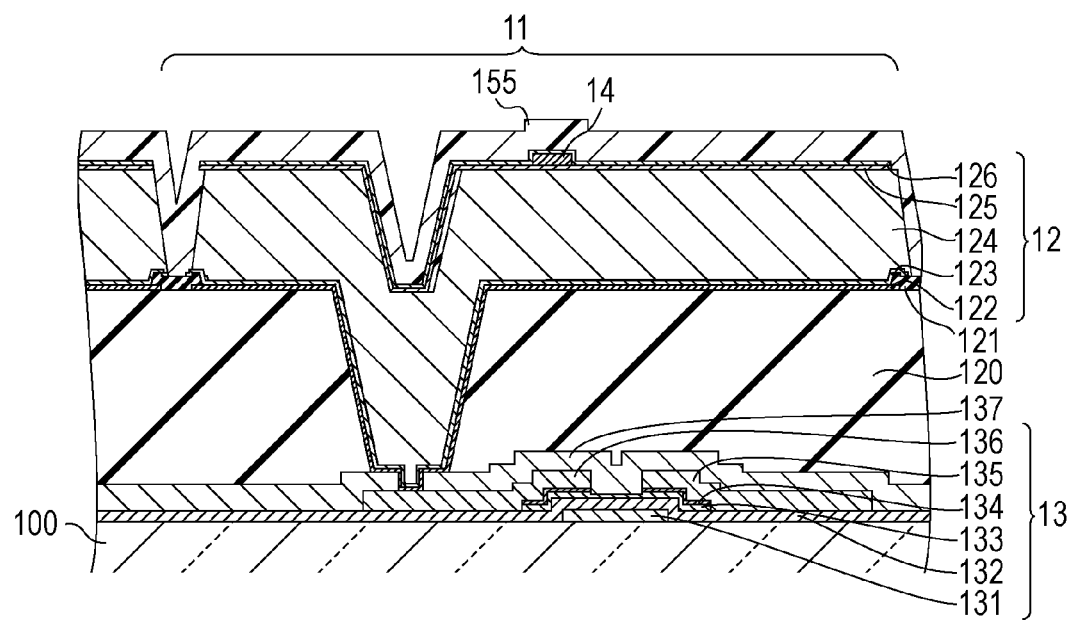
FIG. 4A is a sectional view, per pixel, of a detection device according to a second embodiment.
Figure 4B:
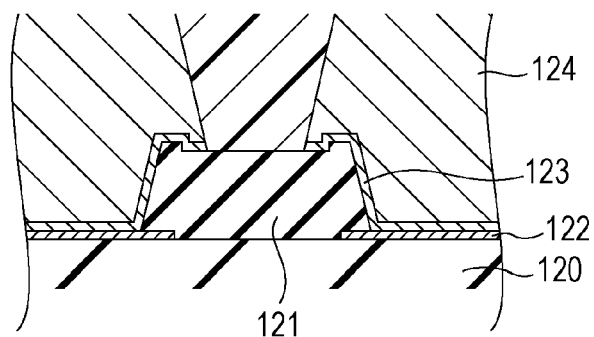
FIG. 4B is an enlarged view of a portion between pixels in FIG. 4A.

The structure of one pixel in a detection device according to a second embodiment will be described below with reference to FIGS. 4A and 4B. FIG. 4A is a sectional view taken along a line corresponding to the line A-A' in FIG. 1A, and FIG. 4B is an enlarged view of a pixel end portion (i.e., a portion between pixels). The same components in the second embodiment as those described above in the first embodiment are denoted by the same reference symbols and detailed description of those components is omitted.

The end of the first electrode 122 is disposed on the insulating member 121 in the first embodiment, while the end of the first electrode 122 is disposed between the interlayer insulating layer 120 and the insulating member 121 in the second embodiment. With such an arrangement, the first electrode 122 made of the transparent conductive oxide is entirely positioned only on the interlayer insulating layer 120, and adhesion between the interlayer insulating layer 120 and the first electrode 122 may be increased in comparison with that in the first embodiment.

A method of manufacturing the detection device according to the second embodiment will be described below with reference to FIGS. 5A to 5J. In particular, operations subsequent to an operation of forming the contact hole in the interlayer insulating layer are described in detail with reference to mask patterns and sectional views during a process. FIGS. 5A, 5C, 5E, 5G and 5I are schematic plan views of mask patterns of photomasks used in successive operations. FIGS. 5B, 5D, 5F, 5H and 5J are schematic sectional views, taken at a position corresponding to the line A-A' in FIG. 1A, in the successive operations. Detailed description of the same operations in the third embodiment as those described above in the first embodiment is omitted.

Figure 5A:
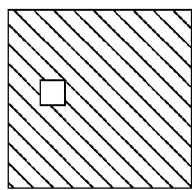
FIGS. 5A, 5C, 5E, 5G and 5I illustrate mask patterns to explain a method of manufacturing the detection device according to the second embodiment.
Figure 5B:
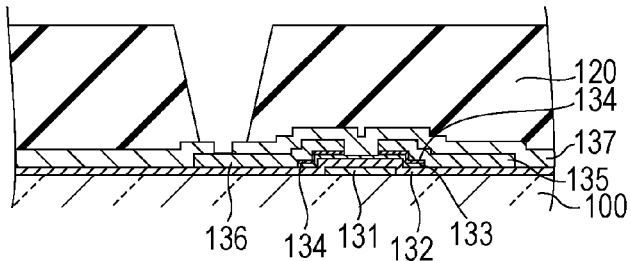
FIGS. 5B, 5D, 5F, 5H and 5J are sectional views to explain the method of manufacturing the detection device according to the second embodiment.
Figure 5C:
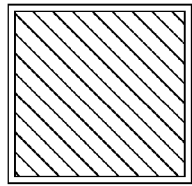

In an operation illustrated in FIG. 5B, an acryl resin as an organic material having photosensitivity is formed as an interlayer insulating film to cover the TFTs 13 and the protection layer 137. The interlayer insulating layer 120 having the contact hole is then formed by using a mask illustrated in FIG. 5A.

Figure 5D:
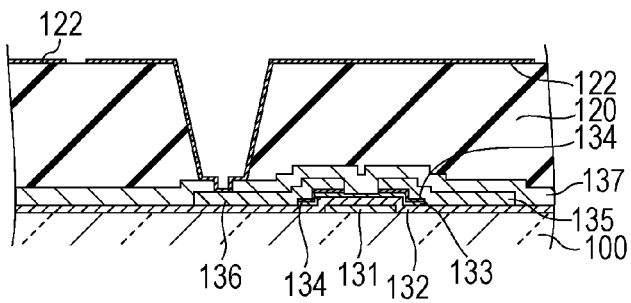
Figure 5E:
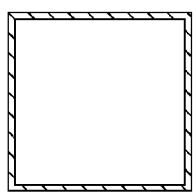

Next, in an operation illustrated in FIG. 5D, an amorphous transparent conductive oxide film made of ITO is formed by sputtering to cover the interlayer insulating layer 120. The transparent conductive oxide film is subjected to wet etching by using a mask illustrated in FIG. 5C and then to annealing for polycrystallization, thereby forming the first electrode 122 of the conversion element. With the polycrystallization, internal stress in the first electrode 122 is increased. However, because the entirety of the first electrode 122 is formed in contact with the interlayer insulating layer 120, adhesion therebetween is held and the problem of peeling-off of the first electrode 122 is not caused.

Figure 5F:
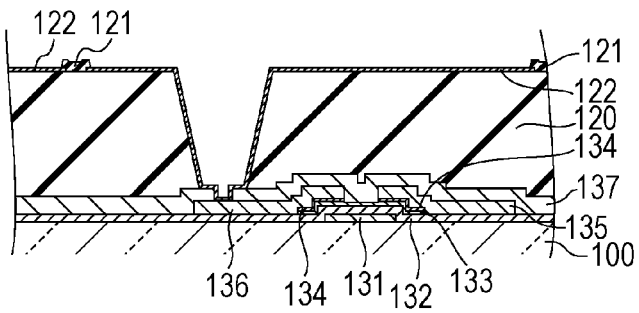
Figure 5G:
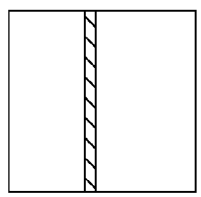

Next, in an operation illustrated in FIG. 5F, an insulating film made of an inorganic material, e.g., a silicon nitride film, is formed by plasma CVD to cover the interlayer insulating layer 120 and the first electrodes 122. The insulating member 121 is then formed between adjacent two of the pixels by etching the insulating film with the use of a mask illustrated in FIG. 5E. Thus, the surface of the interlayer insulating layer 120 is covered with the insulating members 121 and the first electrodes 122.

Figure 5H:
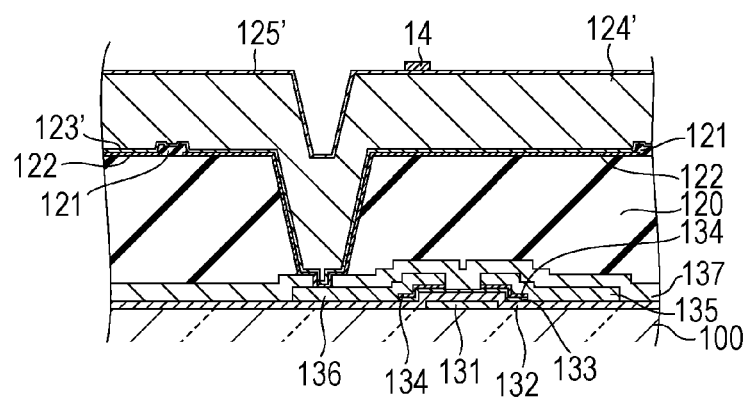
Figure 5I:
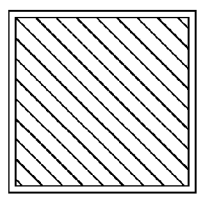

Next, in an operation illustrated in FIG. 5H, an amorphous silicon film mixed with, as an impurity, a pentavalent element, e.g., phosphorus, is formed as an impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. In this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. Such a structure may prevent scattering of the organic material and mixing of the organic material into the impurity semiconductor film of first conductivity type. An electroconductive film made of Al, for example, which becomes the electrode wiring 14, is then formed by sputtering to cover the impurity semiconductor film 125'. Further, the electroconductive film is subjected to wet etching by using a mask illustrated in FIG. 5G, thereby forming the electrode wiring 14.

Figure 5J:
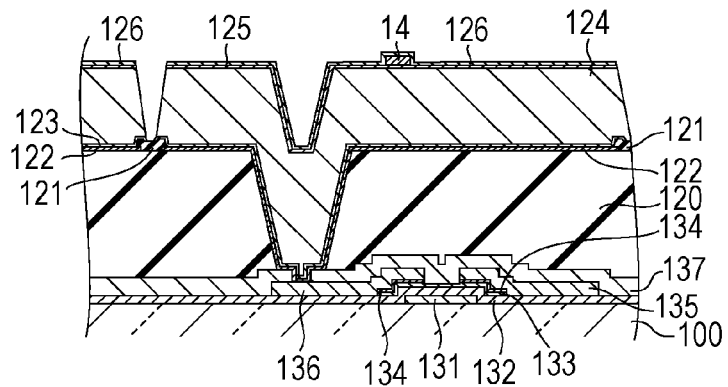

Next, in an operation illustrated in FIG. 5J, a transparent conductive oxide film is formed by sputtering to cover the impurity semiconductor film 125' and the electrode wiring 14. The transparent conductive oxide film is then removed by wet etching with the use of a mask illustrated in FIG. 5I, thereby forming the second electrode 126 of the conversion element 12. Further, the conversion element 12 is isolated per pixel by partly removing the impurity semiconductor film 125', the semiconductor film 124', and the impurity semiconductor film 123' with dry etching using the same mask as that illustrated in FIG. 5I. The isolated conversion element 12 includes the impurity semiconductor layer 125, the semiconductor layer 124, and the impurity semiconductor layer 123 therein. The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the surrounding layers by the organic material may be prevented.

Then, the passivation layer 155 is formed to cover the conversion elements 12 and the insulating members 121, whereby the structure illustrated in FIG. 4A is obtained. When the passivation layer 155 is formed, the interlayer insulating layer 120 is not exposed and contamination of the surrounding layers by the organic material may be prevented.

Third Embodiment

Figure 6A:
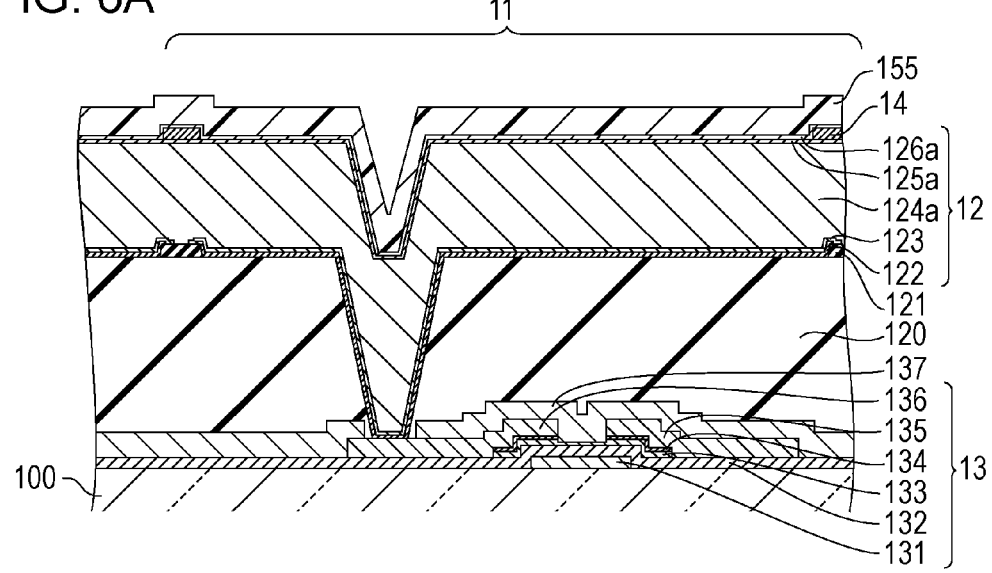
FIG. 6A is a sectional view, per pixel, of a detection device according to a third embodiment.
Figure 6B:
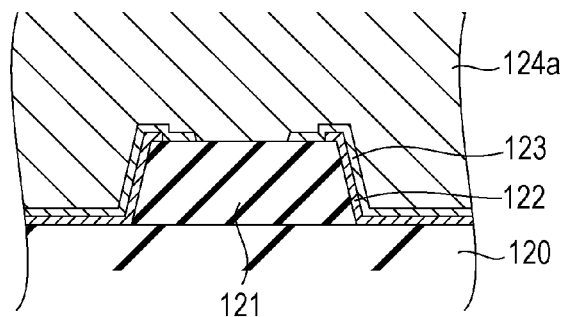
FIG. 6B is an enlarged view of a portion between pixels in FIG. 6A.
Figure 6C:
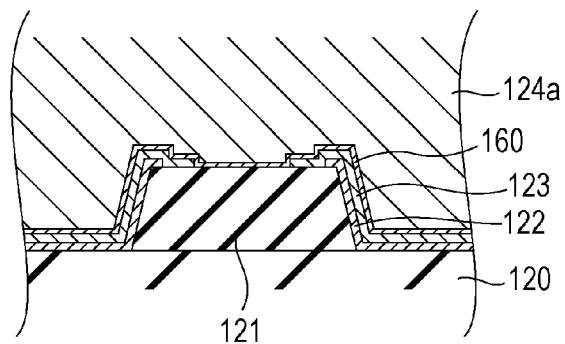
FIG. 6C is an enlarged view illustrating another example of the portion between the pixels in FIG. 6A.

The structure of one pixel in a detection device according to a third embodiment will be described below with reference to FIGS. 6A to 6C. FIG. 6A is a sectional view taken along a line corresponding to the line A-A' in FIG. 1A, and FIG. 6B is an enlarged view of a pixel end portion (i.e., a portion between pixels). FIG. 6C is an enlarged view illustrating another example of the pixel end portion (i.e., the portion between pixels). The same components in the third embodiment as those described above in the foregoing embodiments are denoted by the same reference symbols and detailed description of those components is omitted.

In the first embodiment, the semiconductor layer 124, the impurity semiconductor layer 125, and the second electrode 126 are separated per pixel. On the other hand, in the third embodiment, a semiconductor layer 124a, an impurity semiconductor layer 125a, and a second electrode 126a are each not separated per pixel as illustrated in FIG. 6A. Because the first electrode 122 and the impurity semiconductor layer 123 are each separated per pixel, the conversion element 12 is individualized for each first electrode 122. With the structure of the third embodiment, therefore, an aperture ratio may be increased in comparison with that in the first embodiment. To further ensure individualization of the first electrode 122, as illustrated in FIG. 6C, a semiconductor layer 160 having a higher hydrogen concentration than the semiconductor layer 124a may be disposed in a very thin thickness of about 5 nm to cover the insulating member 121 and the impurity semiconductor layer 123. Because the semiconductor layer 160 has a higher specific resistance than the semiconductor layer 124a and the impurity semiconductor layer 123, leak between the adjacent pixels may be reduced. Further, by setting a thickness of the semiconductor layer 160 to be sufficiently thin so as being able to develop the tunnel effect, electric charges are movable between the impurity semiconductor layer 123 and the semiconductor layer 124a, whereby the conversion element 12 may function as a photodiode. Moreover, since the second electrode 126a is not separated per pixel, the electrode wiring 14 that is a component reducing the aperture ratio may be dispensed with. However, when the resistance is too high with the presence of only the second electrode 126a, it is more beneficial to provide the electrode wiring 14 as well. In such a case, since the semiconductor layer 124a and the second electrode 126a are each not separated per pixel, the electrode wiring 14 may be disposed at a position where the orthographically-projected image of the electrode wiring 14 overlaps with the insulating member 121, and the electrode wiring 14 may be disposed without reducing the aperture ratio.

A method of manufacturing the detection device according to the third embodiment will be described below with reference to FIGS. 7A to 7D. FIGS. 7A and 7C are schematic plan views of mask patterns of photomasks used in successive operations. FIGS. 7B and 7D are schematic sectional views, taken at a position corresponding to the line A-A' in FIG. 1A, in the successive operations. Detailed description of the same operations as those described in the first embodiment is omitted. In particular, since operations until forming the first electrode 122 are the same as those described above with reference to FIGS. 2A to 2F, subsequent operations are described.

In an operation illustrated in FIG. 7B, an amorphous silicon film mixed with, as an impurity, a pentavalent element, e.g., phosphorus, is formed as the impurity semiconductor film 123' of first conductivity type by plasma CVD to cover the insulating members 121 and the first electrodes 122. In this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. Such a structure may prevent scattering of the organic material and mixing of the organic material into the impurity semiconductor film of first conductivity type. The impurity semiconductor film 123' is then partly removed by dry etching with the use of a mask illustrated in FIG. 7A, thereby forming the impurity semiconductor layer 123. The pixel isolation by the dry etching is performed above each of the insulating members 121. Therefore, the insulating member 121 functions as an etching stopper layer, and the interlayer insulating layer 120 is not exposed to the species of the dry etching. Thus, contamination of the impurity semiconductor layer 123 by the organic material may be prevented.

Next, in an operation illustrated in FIG. 7D, an amorphous silicon film becoming the semiconductor layer 124a is formed by plasma CVD to cover the insulating members 121 and the impurity semiconductor layer 123. Further, an amorphous silicon film mixed with, as an impurity, a trivalent element, e.g., boron, which film becomes the impurity semiconductor film 125a of second conductivity type, is formed by plasma CVD. In the case of providing the semiconductor layer 160 illustrated in FIG. 6C, it is beneficial that, when the amorphous silicon film is formed, the amorphous silicon film is first formed in a thickness of about 5 nm at a higher hydrogen concentration and is further formed at a lower hydrogen concentration. Then, an electroconductive film made of Al, for example, which becomes the electrode wiring 14, is formed by sputtering to cover the impurity semiconductor layer 125. Further, the electroconductive film is subjected to wet etching by using a mask illustrated in FIG. 7C, thereby forming the electrode wiring 14.

Next, the second electrode 126a made of a transparent conductive oxide is formed by sputtering to cover the impurity semiconductor film 125' and the electrode wiring 14. Further, the passivation layer 155 is formed to cover the second electrode 126a, whereby the structure illustrated in FIG. 6A is obtained.

Fourth Embodiment

Figure 8A:
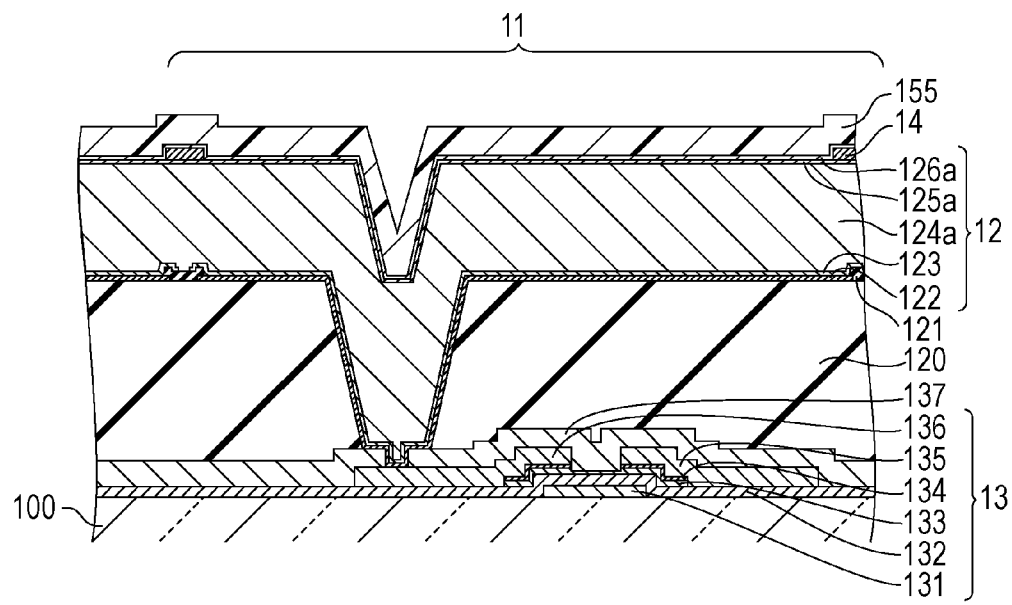
FIG. 8A is a sectional view, per pixel, of a detection device according to a fourth embodiment.
Figure 8B:
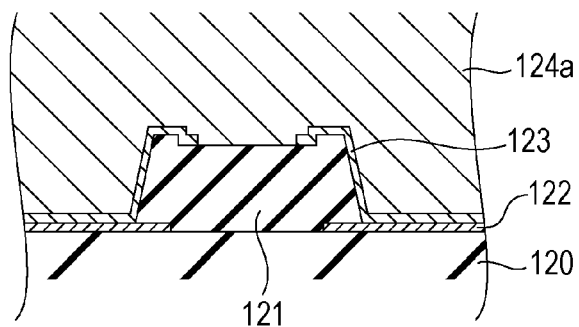
FIG. 8B is an enlarged view of a portion between pixels in FIG. 8A.

The structure of one pixel in a detection device according to a fourth embodiment will be described with reference to FIGS. 8A and 8B. FIG. 8A is a sectional view taken along a line corresponding to the line A-A' in FIG. 1A, and FIG. 8B is an enlarged view of a pixel end portion (i.e., a portion between pixels). The same components in the fourth embodiment as those described above in the foregoing embodiments are denoted by the same reference symbols and detailed description of those components is omitted.

In the second embodiment, the semiconductor layer 124, the impurity semiconductor layer 125, and the second electrode 126 are separated per pixel. On the other hand, in the fourth embodiment, a semiconductor layer 124a, an impurity semiconductor layer 125a, and a second electrode 126a are each not separated per pixel as illustrated in FIG. 8A. Because the first electrode 122 and the impurity semiconductor layer 123 are each separated per pixel, the conversion element 12 is individualized for each first electrode 122. With the structure of the fourth embodiment, therefore, an aperture ratio may be increased in comparison with that in the second embodiment. Further, since the second electrode 126a is not separated per pixel, the electrode wiring 14 that is a component reducing the aperture ratio may be dispensed with. However, when the resistance is too high with the presence of only the second electrode 126a, it is more beneficial to provide the electrode wiring 14 as well. In such a case, since the semiconductor layer 124a and the second electrode 126a are each not separated per pixel, the electrode wiring 14 may be disposed at a position where the orthographically-projected image of the electrode wiring 14 overlaps with the insulating member 121, and the electrode wiring 14 may be disposed without reducing the aperture ratio.

A manufacturing method in the fourth embodiment is similar to the operations of FIGS. 5B, 5D and 5F, described above in the second embodiment, until the operation of forming the insulating member 121, and operations subsequent to the operation of forming the impurity semiconductor layer 123 are similar to the operations described above in the third embodiment. Hence detailed description of the manufacturing method in the fourth embodiment is omitted.

Fifth Embodiment

Figure 9A:
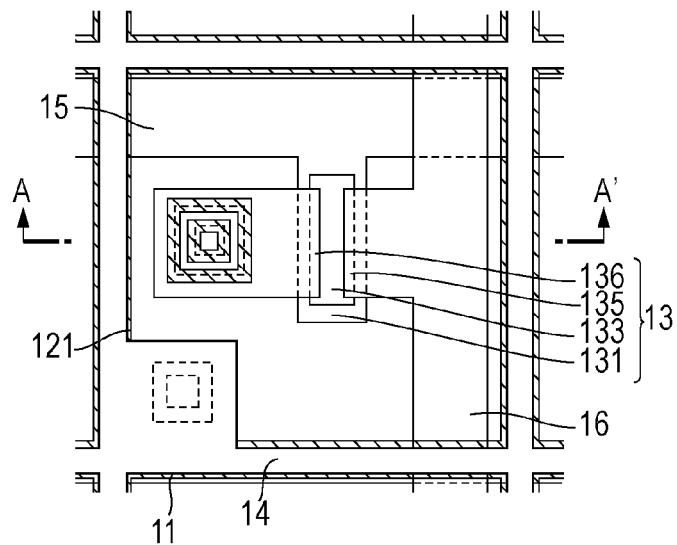
FIG. 9A is a plan view, per pixel, of a detection device according to a fifth embodiment.
Figure 9B:
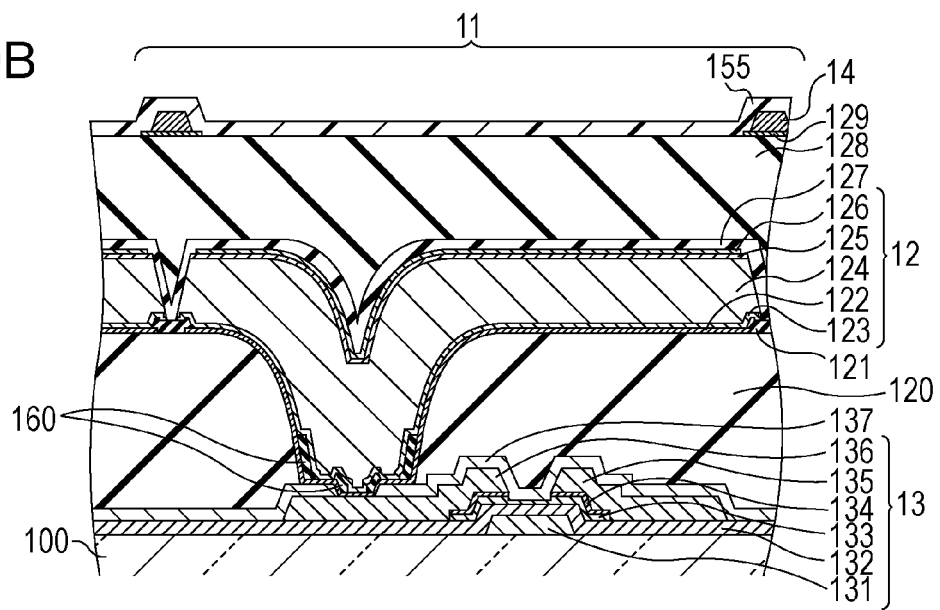
FIG. 9B is a sectional view taken along a line A-A' in FIG. 9A.
Figure 9C:
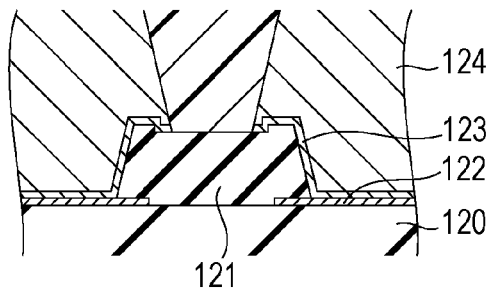
FIG. 9C is an enlarged view of a portion between pixels in FIG. 9A.

The structure of one pixel in a detection device according to a fifth embodiment will be described with reference to FIGS. 9A to 9C. FIG. 9A is a plan view per pixel. For the sake of simplicity, regarding a conversion element, only a first electrode is illustrated in FIG. 9A. FIG. 9B is a sectional view taken along a line A-A' in FIG. 9A, and FIG. 9C is an enlarged view of a pixel end portion (i.e., a portion between pixels).

In the second embodiment, when the insulating member 121 is formed by etching the insulating film, the second main electrode 136 and the protection layer 137 are present in contact with the first electrode 122 such that they are covered with the first electrode 122. Depending on the crystallinity and the film thickness of the first electrode 122, however, an etchant used in etching the insulating film may reach the second main electrode 136 and the protection layer 137. For example, in the contact hole of the interlayer insulating layer 120, there are level differences formed by the protection layer 137 and the interlayer insulating layer 120. When the first electrode 122 is formed over an area including such a level difference, coverage of the first electrode 122 may become insufficient in its portion including the level difference. In that case, the etchant is more apt to permeate through the first electrode 122, whereby the protection layer 137 may be exposed to the etchant.

To cope with the above-mentioned problem, this embodiment has a structure including a coating layer 160 that covers at least the portion of the first electrode 122 including the level difference within the contact hole of the interlayer insulating layer 120. In the etching operation to form the insulating member 121, the coating layer 160 may inhibit the second main electrode 136 and the protection layer 137, which are present in contact with the first electrode 122, from being exposed to the etchant, and may protect them against the etchant. The coating layer 160 directly or indirectly covers an area of the protection layer 137 corresponding to the portion of the first electrode 122 including the level difference, i.e., an area of the protection layer 137 where an orthographically-projected image of the portion of the first electrode 122 including the level difference is positioned. Stated another way, the coating layer 160 inhibits the protection layer 137 from being etched in the operation of etching the inorganic insulating material of the insulating member 121. Thus, the coating layer 160 suppresses the permeation of the etchant in order to maintain a state that the protection layer 137 may sufficiently develop its function in the etching operation. To that end, the coating layer 160 has material properties and film properties sufficient to suppress the permeation of the etchant. In this embodiment, an insulating layer formed by leaving the inorganic insulating material, which is coated to form the insulating member 121, is employed as the coating layer 160.

A method of manufacturing the detection device according to the fifth embodiment will be described below with reference to FIGS. 10A to 10J and FIGS. 11A to 11H. In particular, operations subsequent to an operation of forming the contact hole in the interlayer insulating layer 120 are described in detail with reference to mask patterns and sectional views during a process. FIGS. 10A, 10C, 10E, 10G and 10I and FIGS. 11A, 11C, 11E and 11G are schematic plan views of mask patterns of photomasks used in successive operations. FIGS. 10B, 10D, 10F, 10H and 10J and FIGS. 11B, 11D, 11F and 11H are schematic sectional views, taken at a position corresponding to the line A-A' in FIG. 9A, in the successive operations.

In an initial state, the plurality of TFTs 13 are disposed on the insulating substrate 100, and the protection layer 137 is disposed over the plurality of TFTs 13. The contact hole is formed by etching in a portion of the protection layer 137 above the second main electrode 136 for electrical connection to the photodiode. The same components as those described above in the foregoing embodiments are denoted by the same reference symbols and detailed description of those components is omitted.

In an operation illustrated in FIG. 10B, an acryl resin as an organic material having photosensitivity is formed as an interlayer insulating film to cover the TFTs 13 and the protection layer 137 by using a coating apparatus, e.g., a spinner. A polyimide resin, for example, may also be used as the organic material having photosensitivity. By using a mask illustrated in FIG. 10A, the interlayer insulating layer 120 having the contact hole is then formed through exposure and development.

Next, in an operation illustrated in FIG. 10D, an electroconductive film made of a metal, e.g., Al, is formed by sputtering to cover the interlayer insulating layer 120. Further, the electroconductive film is subjected to wet etching by using a mask illustrated in FIG. 10C, thereby forming the first electrode 122 of the conversion element.

Next, in an operation illustrated in FIG. 10F, an insulating film made of a general inorganic material, e.g., a silicon nitride film or a silicon oxide film, is formed by plasma CVD to cover the interlayer insulating layer 120 and the first electrodes 122. The insulating film is then etched by using a mask illustrated in FIG. 10E, thereby forming the insulating member 121 between the pixels and leaving the coating layer 160 that covers at least the portion of the first electrode 122 including the level difference and located within the contact hole. By leaving the coating layer 160 made of the inorganic insulating material to cover the portion of the first electrode 122 including the level difference, the portion of the first electrode 122 including the level difference may be avoided from being exposed to the etchant in the above-described etching. It is hence possible to inhibit the second main electrode 136 and the protection layer 137, which are present in contact with the portion of the first electrode 122 including the level difference, from being exposed to the etchant, and to protect the second main electrode 136 and the protection layer 137 against the etchant.

Figure 10G:
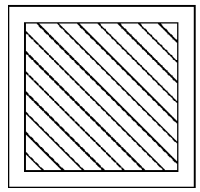
Figure 10H:
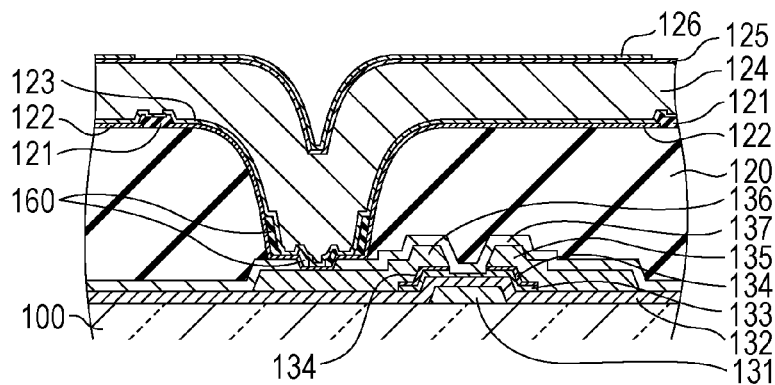

Next, in an operation illustrated in FIG. 10H, an amorphous silicon film mixed with, as an impurity, a pentavalent element, e.g., phosphorus, is formed as an impurity semiconductor film 123' of first conductivity type by plasma CVD to cover the insulating members 121, the coating layers 160, and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. When the impurity semiconductor film 123' is formed, the interlayer insulating layer 120 is exposed to plasma if the interlayer insulating layer 120 is not covered with the insulating members 121 and the first electrodes 122. If the interlayer insulating layer 120 made of the organic material is exposed to plasma, the organic material may be scattered and mixed into the impurity semiconductor film 123'. To cope with such a problem, in this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. Such a structure may prevent scattering of the organic material and mixing of the organic material into the impurity semiconductor film of first conductivity type. A transparent conductive oxide film made of, e.g., ITO, which becomes the second electrode 126, is then formed by sputtering to cover the impurity semiconductor film 125'. The transparent conductive oxide film is then subjected to wet etching by using a mask illustrated in FIG. 10G, thereby forming the second electrode 126.

Figure 10I:
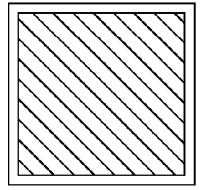
Figure 10J:
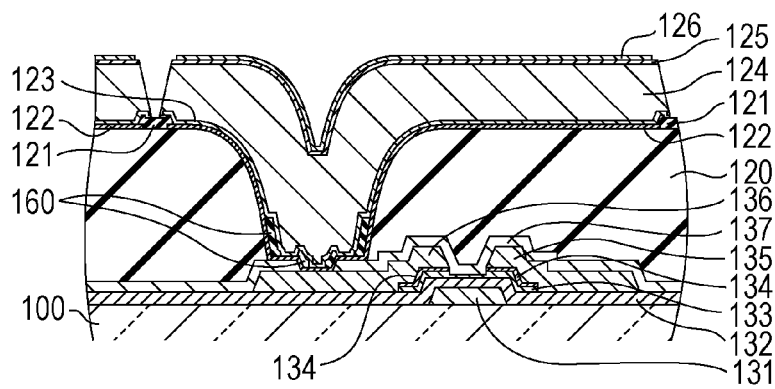

Next, in an operation illustrated in FIG. 10J, the conversion element 12 is isolated per pixel by partly removing the impurity semiconductor film 125', the semiconductor film 124', and the impurity semiconductor film 123' with dry etching using a mask illustrated in FIG. 10I. The isolated conversion element 12 includes the impurity semiconductor layer 125, the semiconductor layer 124, and the impurity semiconductor layer 123 therein. The pixel isolation by the dry etching is performed above each of the insulating members 121. Therefore, each insulating member 121 functions as an etching stopper layer, and the interlayer insulating layer 120 is not exposed to the species of the dry etching. Thus, contamination of the surrounding layers by the organic material may be prevented. Further, the first electrode 122 is covered with the impurity semiconductor layer 123. Accordingly, the obtained structure does not include the so-called Schottky junction, i.e., direct junction between the first electrode 122 and the semiconductor layer 124. While, in this embodiment, the transparent conductive oxide is used as the material of the second electrode 126, the disclosure is not limited to such an example as long as an electroconductive film is used. As another example, when an element directly converting radiation to electric charges is used as the conversion element 12, an electroconductive film made of, e.g., Al, through which radiation is able to easily pass, may be used as the second electrode 126.

Figure 11A:
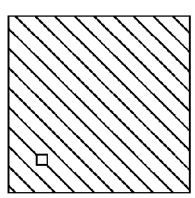
FIGS. 11A, 11C, 11E, and 11G illustrate mask patterns to explain the method of manufacturing the detection device according to the fifth embodiment.
Figure 11B:
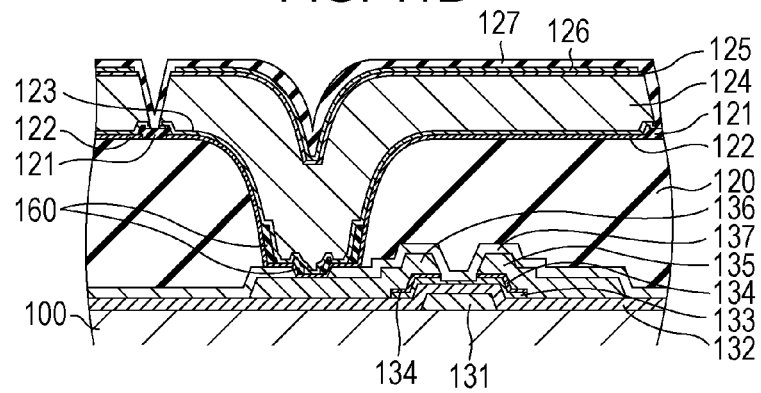
FIGS. 11B, 11D, 11F, and 11H are sectional views to explain the method of manufacturing the detection device according to the fifth embodiment.
Figure 11C:
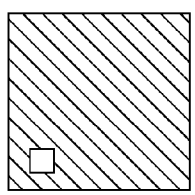

Next, in an operation illustrated in FIG. 11B, an insulating film made of an inorganic material, e.g., a silicon nitride film, is formed by plasma CVD to cover the conversion elements 12 and the insulating members 121. When that insulation layer is formed, the surface of the interlayer insulating layer 120 is not exposed and contamination of the surrounding layers by the organic material may be prevented. The insulating film is then subjected to dry etching by using a mask illustrated in FIG. 11A, thereby forming an insulating layer 127.

Figure 11D:
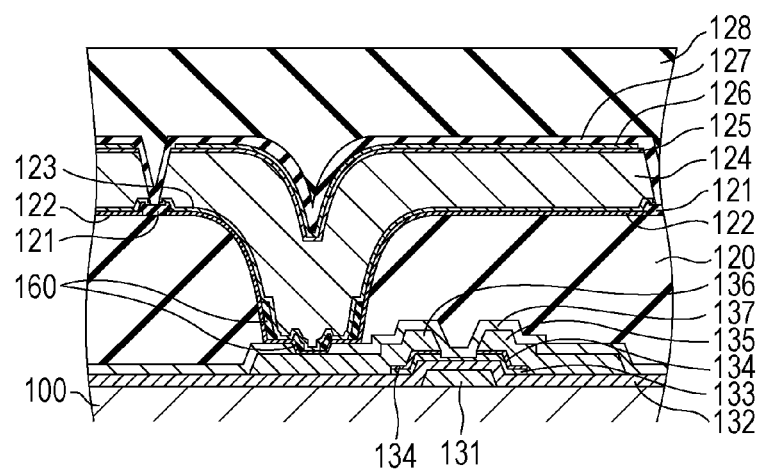
Figure 11E:
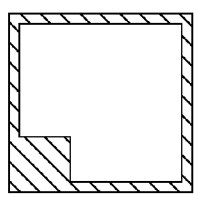

Next, in an operation illustrated in FIG. 11D, an acryl resin as an organic material having photosensitivity is formed as an interlayer insulating film to cover the second electrode 126 and the insulating layer 127. An interlayer insulating layer 128 including the contact hole is then formed by using a mask illustrated in FIG. 11C.

Figure 11F:
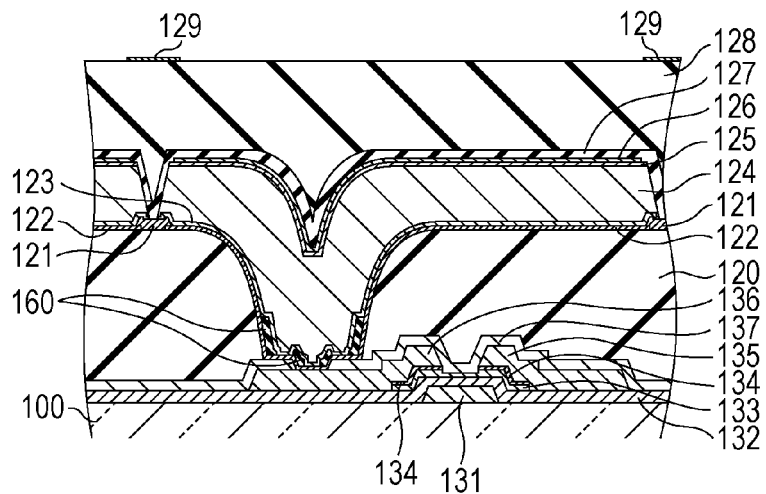
Figure 11G:
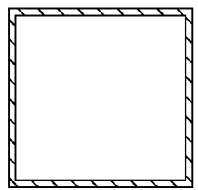

Next, in an operation illustrated in FIG. 11F, a transparent conductive oxide film is formed by sputtering. The transparent conductive oxide film is then subjected to wet etching by using a mask illustrated in FIG. 11E, thereby forming an electroconductive layer 129.

Figure 11H:
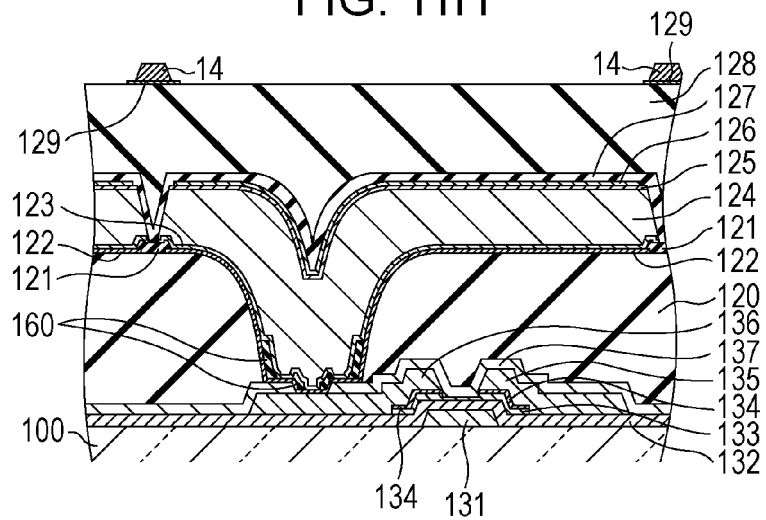

Next, in an operation illustrated in FIG. 11H, an electroconductive film made of Al, for example, which becomes the electrode wiring 14, is formed by sputtering. Further, the electroconductive film is subjected to wet etching by using a mask illustrated in FIG. 11G, thereby forming the electrode wiring 14. At that time, the electrode wiring 14 is formed such that an orthographically-projected image of the electrode wiring 14 is positioned in overlapped relation to the insulating member 121. With the operation mentioned above, the electrode wiring 14 and the second electrode 126 of the conversion element 12 are electrically connected to each other through the electroconductive layer 129. On that occasion, a reduction of the aperture ratio may be suppressed by using the transparent conductive oxide to form the electroconductive layer 129.

Then, the passivation layer 155 is formed to cover the electrode wiring 14, the electroconductive layer 129, and the interlayer insulating layer 128, whereby the structure illustrated in FIG. 9B is obtained.

In the structure illustrated in FIG. 9B, the insulating coating layer 160 is disposed between a part of the first electrode 122 and the impurity semiconductor layer 123. However, there are no problems because electric charges may be collected into the electroconductive layer 122 through the impurity semiconductor layer 123.

While, in the structure of this embodiment, the coating layer 160 covers only the portion of the first electrode 122 including the level difference, the disclosure is not limited to such an example. The coating layer 160 may be disposed on the first electrode 122 to cover its area positioned within the contact hole in order that the coating layer 160 is coated on the first electrode 122 with good adhesion.

While, in this embodiment, the insulating member 121 and the coating layer 160 are simultaneously formed by using the insulating film made of the same inorganic material, the disclosure is not limited to such an example. An electroconductive material may also be used as the coating layer 160. When the coating layer 160 is made of an electroconductive material, the electric charges generated in the conversion element may be more efficiently collected than when the coating layer 160 is made of an inorganic insulating material. In such a case, a method of manufacturing the detection device is practiced by dividing the operation illustrated in FIG. 10F into two operations illustrated in FIGS. 12B and 12D.

Figure 12A:
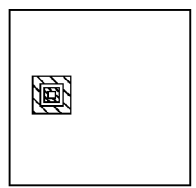
FIGS. 12A and 12C illustrate mask patterns to explain the method of manufacturing the detection device according to the fifth embodiment.
Figure 12B:
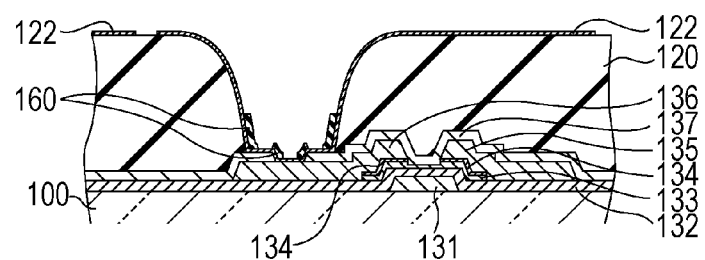
FIGS. 12B and 12D are sectional views to explain the method of manufacturing the detection device according to the fifth embodiment.
Figure 13A:
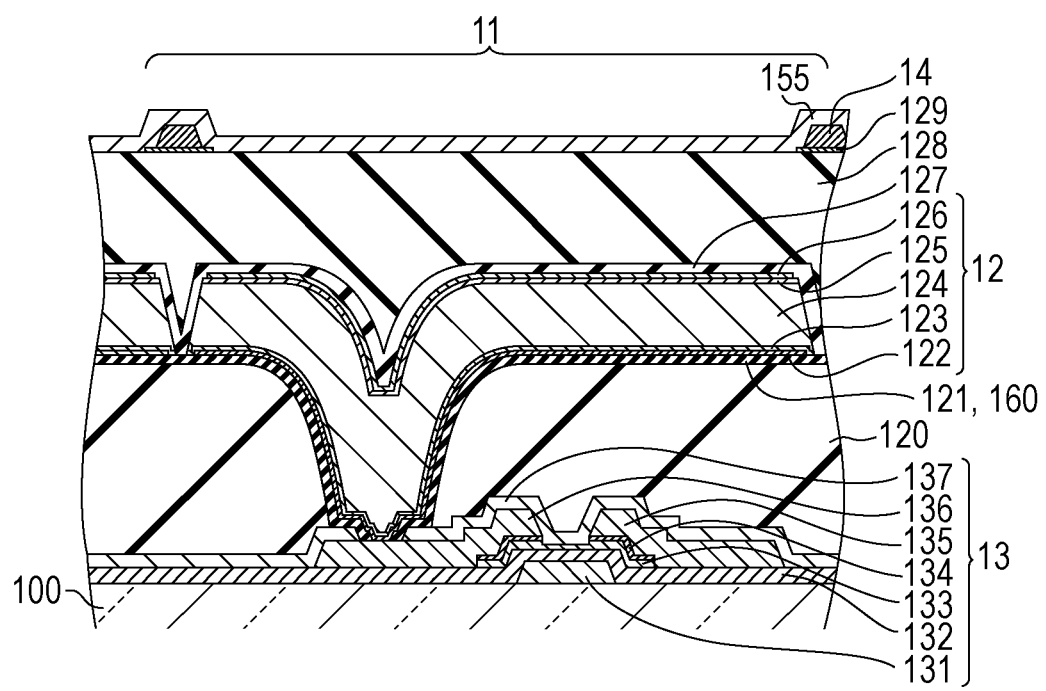
FIG. 13A is a sectional view, per pixel, of a detection device according to a sixth embodiment.
Figure 13B:
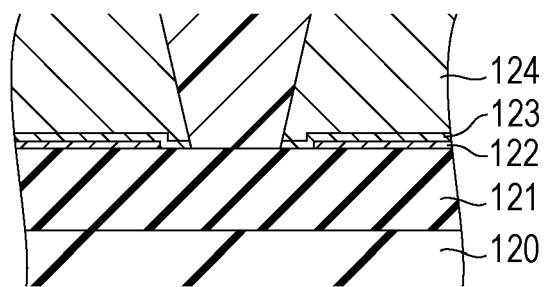
FIG. 13B is an enlarged view of a portion between pixels in FIG. 13A.

First, in an operation illustrated in FIG. 12B, an electroconductive film is formed by sputtering to cover the interlayer insulating layer 120 and the first electrodes 122. The electroconductive film is then subjected to wet etching by using a mask illustrated in FIG. 13A, thereby forming the coating layer 160. The material and the thickness of the electroconductive film formed in the operation illustrated in FIG. 13B is to be endurable against the etching that is performed on the insulating film made of the inorganic material in the operation illustrated in FIG. 10F. For example, when the insulating member 121 is formed by wet etching using, e.g., hydrofluoric acid in the operation illustrated in FIG. 10F, a metal material having resistance against the hydrofluoric acid, such as Mo, Cr, Pt or Au, or an alloy material having resistance against the hydrofluoric acid, such as MoCr, may be used. When the insulating member 121 is formed by dry etching in the operation illustrated in FIG. 10F, an alloy material, such as MoCr, MoW or WN, may be used.

Figure 12C:
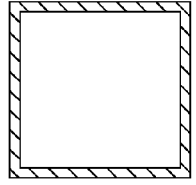
Figure 12D:
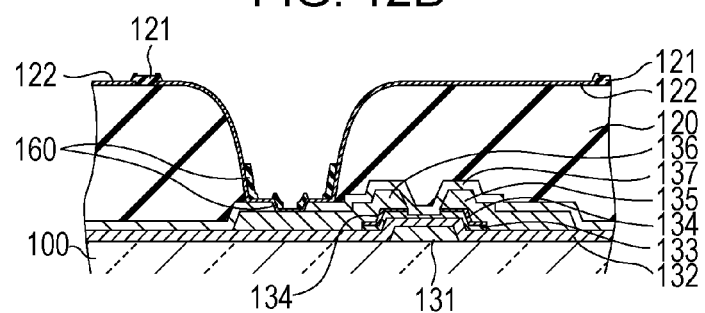

Next, in an operation illustrated in FIG. 12D, an insulating film made of a general inorganic material, e.g., a silicon nitride film or a silicon oxide film, is formed by plasma CVD to cover the interlayer insulating layer 120, the first electrodes 122, and the coating layers 160. The insulating film is then etched by using a mask illustrated in FIG. 12C, thereby forming the insulating member 121 between adjacent two of the pixels.

Sixth Embodiment

The structure of one pixel in a detection device according to a sixth embodiment will be described below with reference to FIGS. 13A and 13B. FIG. 13A is a sectional view taken along a line corresponding to the line A-A' in FIG. 9A, and FIG. 13B is an enlarged view of a pixel end portion (i.e., a portion between pixels).

In the sixth embodiment, the insulating member 121 is disposed to cover the interlayer insulating layer 120 such that an opening is formed only in an area where the second main electrode 136 and the first electrode 122 are contacted with each other within the contact hole of the interlayer insulating layer 120. Further, in the sixth embodiment, because a most part of the first electrode 122 is disposed in contact with the insulating member 121, the first electrode 122 is made of a metal material having higher adhesion with respect to the insulating member 121 than a transparent conductive oxide film. With such an arrangement, the insulating member 121 serving also as a coating layer is disposed between the protection layer 137 and the first electrode 122. Therefore, the protection layer 137 may be avoided from being exposed to the etchant, and the protection layer 137 may be protected against the etchant.

A method of manufacturing the detection device according to the sixth embodiment will be described below with reference to FIGS. 14A to 14H. In particular, operations from an operation of forming the contact hole in the interlayer insulating layer 120 to an operation of isolating a sensor per pixel are described in detail with reference to mask patterns and sectional views during a process. FIGS. 14A, 14C, 14E and 14G are schematic plan views of mask patterns of photomasks used in successive operations. FIGS. 14B, 14D, 14F and 14H are schematic sectional views, taken at a position corresponding to the line A-A' in FIG. 9A, in the successive operations.

In an initial state, the plurality of TFTs 13 are disposed on the insulating substrate 100, and the protection layer 137 is disposed over the plurality of TFTs 13. The contact hole is formed by etching in a portion of the protection layer 137 above the second main electrode 136 for electrical connection to the photodiode. The same components as those described above in the foregoing embodiments are denoted by the same reference symbols and detailed description of those components is omitted.

Figure 14A:
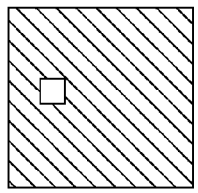
Figure 14B:
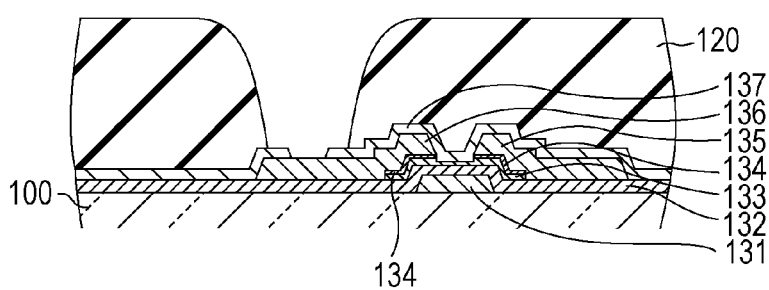
Figure 14C:
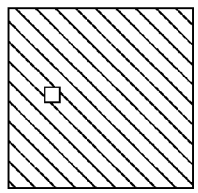

In an operation illustrated in FIG. 14B, an acryl resin as an organic material having photosensitivity is formed as an interlayer insulating film to cover the TFTs 13 and the protection layer 137 by using a coating apparatus, e.g., a spinner. A polyimide resin, for example, may also be used as the organic material having photosensitivity. By using a mask illustrated in FIG. 14A, the interlayer insulating layer 120 having the contact hole is then formed through exposure and development.

Figure 14D:
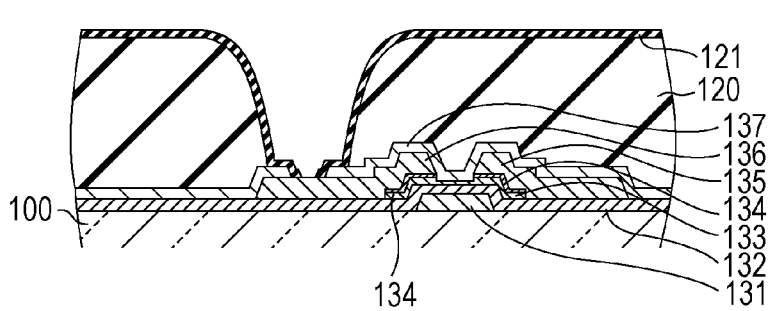

Next, in an operation illustrated in FIG. 14D, an insulating film made of a general inorganic material, e.g., a silicon nitride film or a silicon oxide film, is formed by plasma CVD to cover the interlayer insulating layer 120. The insulating film is then etched by using a mask illustrated in FIG. 14C, thereby forming the insulating member 121 such that the insulating member 121 is opened only in an area corresponding to a part of the second main electrode 136 within the contact hole of the interlayer insulating layer 120. The insulating member 121 serves also as a coating layer. Such an arrangement may inhibit the protection layer 137 from being exposed to the etchant and may ensure the stable process.

Next, in an operation illustrated in FIG. 14F, an electroconductive film made of a metal material, e.g., Al, is formed by sputtering. Further, the electroconductive film is subjected to wet etching by using a mask illustrated in FIG. 14E, thereby forming the first electrode 122 of the conversion element.

Next, in an operation illustrated in FIG. 14H, an amorphous silicon film mixed with, as an impurity, a pentavalent element, e.g., phosphorus, is formed as an impurity semiconductor film 123' of first conductivity type by plasma CVD to cover the insulating members 121 and the first electrodes 122. Then, a semiconductor film 124' made of an amorphous silicon film and an impurity semiconductor film 125' of second conductivity type, i.e., an amorphous silicon film mixed with, as an impurity, a trivalent element, e.g., boron, are formed in that order by plasma CVD. When the impurity semiconductor film 123' is formed, the interlayer insulating layer 120 is exposed to plasma if the interlayer insulating layer 120 is not covered with the insulating members 121 and the first electrodes 122. If the interlayer insulating layer 120 made of the organic material is exposed to plasma, the organic material may be scattered and mixed into the impurity semiconductor film 123'. To cope with such a problem, in this embodiment, the interlayer insulating layer 120 is covered with the insulating members 121 and the first electrodes 122 to provide a structure that the surface of the interlayer insulating layer 120 is not exposed when the impurity semiconductor film 123' becoming the impurity semiconductor layer 123 of first conductivity type is formed. Such a structure may prevent scattering of the organic material and mixing of the organic material into the impurity semiconductor film of first conductivity type. A transparent conductive oxide film made of, e.g., ITO, which becomes the second electrode 126, is then formed by sputtering to cover the impurity semiconductor film 125'. The transparent conductive oxide film is then subjected to wet etching by using a mask illustrated in FIG. 14G, thereby forming the second electrode 126.

Operations subsequent to the operation of forming the second electrode 126 are similar to those described above in the fifth embodiment and detailed description of those operations is omitted.

Seventh Embodiment

Figure 15A:
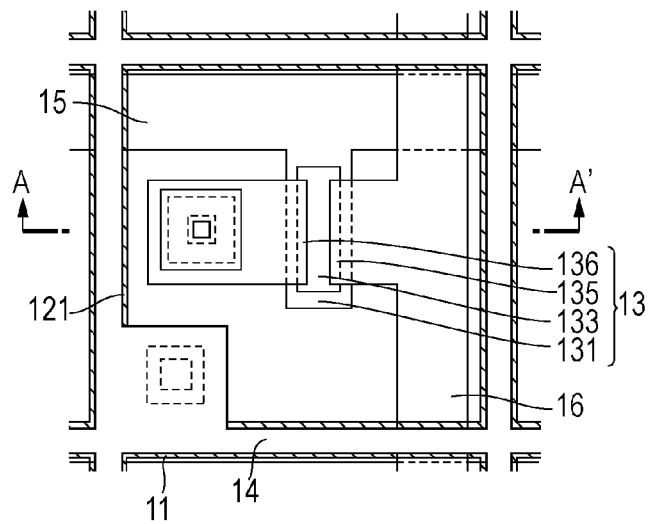
FIG. 15A is a plan view, per pixel, of a detection device according to a seventh embodiment.
Figure 15B:
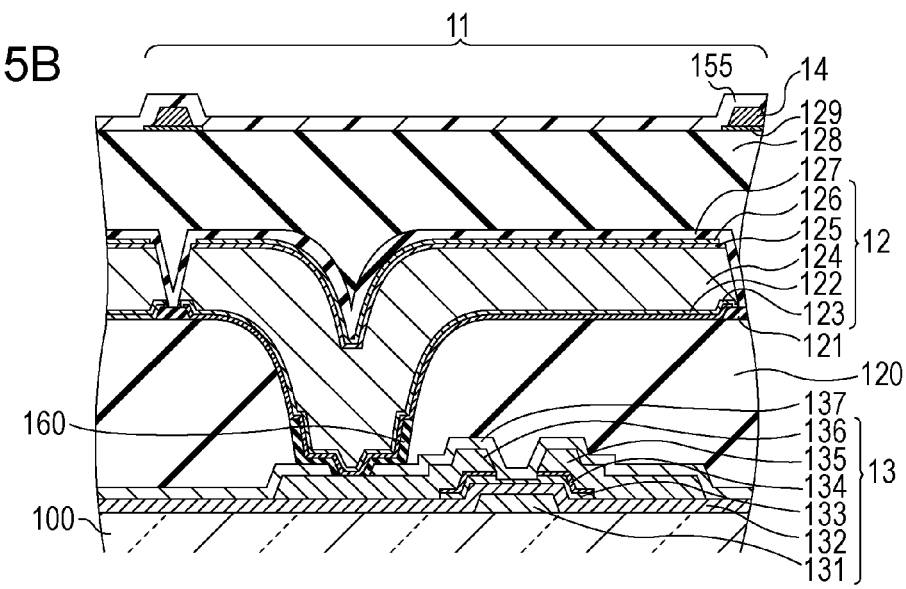
FIG. 15B is a sectional view taken along a line A-A' in FIG. 15A.
Figure 15C:
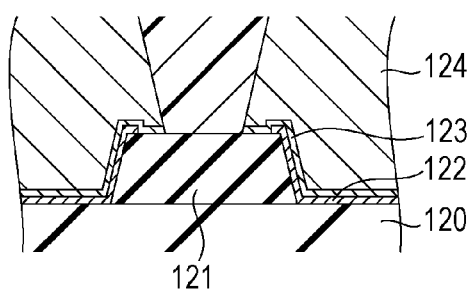
FIG. 15C is an enlarged view of a portion between pixels in FIG. 15A.

The structure of one pixel in a detection device according to a seventh embodiment will be described below with reference to FIGS. 15A to 15C. FIG. 15A is a plan view per pixel. For the sake of simplicity, regarding a conversion element, only a first electrode is illustrated in FIG. 15A. FIG. 15B is a sectional view taken along a line A-A' in FIG. 15A, and FIG. 15C is an enlarged view of a pixel end portion (i.e., a portion between pixels).

The seventh embodiment represents a structure obtained by forming the insulating member 121 and the first electrode 122 after forming the coating layer 160. In this case, the coating layer 160 is disposed between each of the interlayer insulating layer 120 and the protection layer 137 and corresponding one of portions of the first electrode 122, formed later, each including a level difference located within the contact hole of the interlayer insulating layer 120. Such a structure may inhibit the protection layer 137 from being exposed to an etchant in an operation of etching the insulating member 121, and may protect the protection layer 137 against the etchant.

A method of manufacturing the detection device according to the seventh embodiment will be described below with reference to FIGS. 16A to 16H. In particular, operations subsequent to an operation of forming the contact hole in the interlayer insulating layer 120 are described in detail with reference to mask patterns and sectional views during a process. FIGS. 16A, 16C, 16E and 16G are schematic plan views of mask patterns of photomasks used in successive operations. FIGS. 16B, 16D, 16F and 16H are schematic sectional views, taken at a position corresponding to the line A-A' in FIG. 15A, in the successive operations.

In an initial state, the plurality of TFTs 13 are disposed on the insulating substrate 100, and the protection layer 137 is disposed over the plurality of TFTs 13. The contact hole is formed by etching in a portion of the protection layer 137 above the second main electrode 136 for electrical connection to the photodiode. The same components as those described above in the foregoing embodiments are denoted by the same reference symbols and detailed description of those components is omitted.

In an operation illustrated in FIG. 16B, an acryl resin as an organic material having photosensitivity is formed as an interlayer insulating film to cover the TFTs 13 and the protection layer 137 by using a coating apparatus, e.g., a spinner. A polyimide resin, for example, may also be used as the organic material having photosensitivity. By using a mask illustrated in FIG. 16A, the interlayer insulating layer 120 having the contact hole is then formed through exposure and development.

Next, in an operation illustrated in FIG. 16D, an insulating film made of a general inorganic insulating material, e.g., a silicon nitride film or a silicon oxide film, is formed by plasma CVD to cover the interlayer insulating layer 120. The insulating film is then etched by using a mask illustrated in FIG. 16C, thereby forming the coating layer 160 that covers the interlayer insulating layer 120 and the protection layer 137 in areas in each of which a portion of the first electrode 122 including the level difference is to be positioned in a later operation.

Next, in an operation illustrated in FIG. 16F, an insulating film made of a general inorganic material, e.g., a silicon nitride film or a silicon oxide film, is formed by plasma CVD to cover the interlayer insulating layer 120 and the coating layer 160. The insulating film is then etched by using a mask illustrated in FIG. 16E, thereby forming the insulating member 121 between the pixels. In that etching operation, the areas of the interlayer insulating layer 120 and the protection layer 137 in each of which the portion of the first electrode 122 including the level difference is to be positioned in a later operation are covered with the coating layer 160. Such an arrangement may inhibit the protection layer 137 from being exposed to the etchant and may avoid the protection layer 137 from being etched in the above-mentioned etching operation.

Next, in an operation illustrated in FIG. 16H, an electroconductive film made of a metal material, e.g., Al, is formed by sputtering to cover the interlayer insulating layer 120. Further, the electroconductive film is subjected to wet etching by using a mask illustrated in FIG. 16G, thereby forming the first electrode 122 of the conversion element. Operations subsequent to the operation of forming the first electrode 122 are similar to those described above in the fifth embodiment and detailed description of those operations is omitted. Thus, the surface of the interlayer insulating layer 120 is covered with the plurality of insulating members 121 and the plurality of first electrodes 122. Accordingly, when the impurity semiconductor layer 123 of first conductivity type, the semiconductor layer (amorphous silicon) 124, and the impurity semiconductor layer 125 of second conductivity type are formed, contamination of those layers by the organic material of the interlayer insulating layer 120 may be avoided.

Figure 17A:
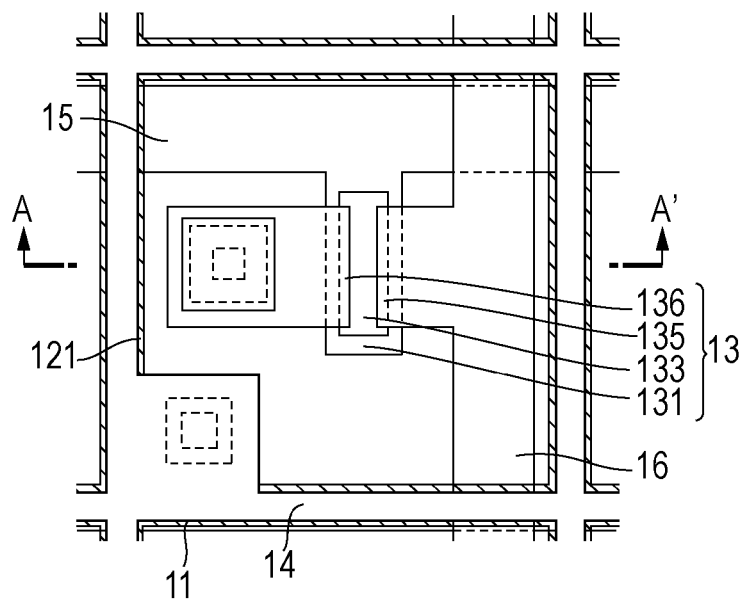
FIG. 17A is a plan view, per pixel, of a detection device according to a modification of the seventh embodiment.
Figure 17B:
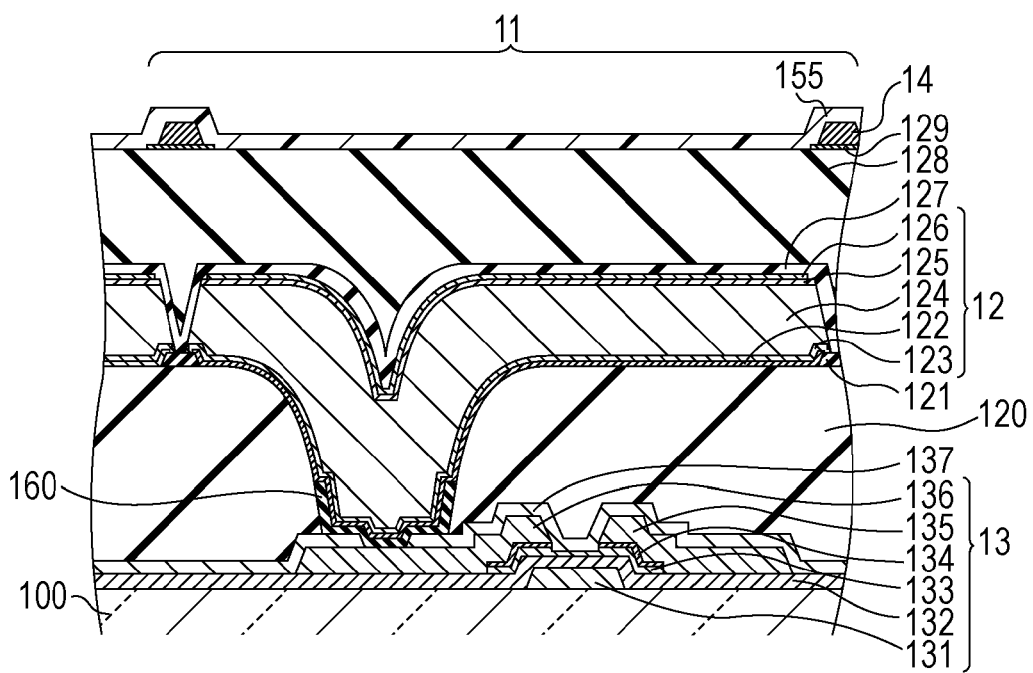
FIG. 17B is a sectional view taken along a line A-A' in FIG. 17A.

While, in this embodiment, the inorganic insulating material is used as the coating layer 160, the disclosure is not limited to such an example. An electroconductive material may also be used as the coating layer 160. When the coating layer 160 is made of an electroconductive material, the coating layer 160 may be disposed to cover the second main electrode 136 positioned within the contact hole of the protection layer 137, as illustrated in FIG. 17B, in addition to the areas of the interlayer insulating layer 120 and the protection layer 137 in each of which the portion of the first electrode 122 including the level difference is positioned. Such an arrangement may inhibit not only the protection layer 137, but also the second main electrode 136, from being exposed to the etchant. Hence the second main electrode 136 and the protection layer 137 may be avoided from being etched in the above-mentioned etching operation. FIG. 17B is a sectional view taken along a line A-A' in FIG. 17A that is a plan view. In such a case, a method of manufacturing the detection device is practiced by replacing the operation illustrated in FIG. 16D with an operation illustrated in FIG. 18B.

Figure 18A:
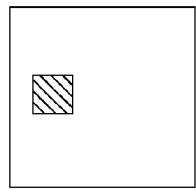
FIG. 18A illustrates a mask pattern to explain a method of manufacturing the detection device according to the modification of the seventh embodiment.
Figure 18B:
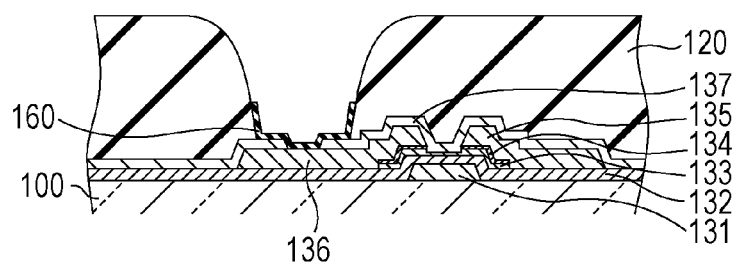
FIG. 18B is a sectional view to explain the method of manufacturing the detection device according to the modification of the seventh embodiment.

In the operation illustrated in FIG. 18B, an electroconductive film is formed by sputtering to cover the interlayer insulating layer 120. The electroconductive film is then subjected to wet etching by using a mask illustrated in FIG. 18A, thereby forming the coating layer 160. The material and the thickness of the electroconductive film formed in the operation illustrated in FIG. 18B may be selected as discussed above in connection with the operation illustrated in FIG. 10F.

Eighth Embodiment

Figure 19:
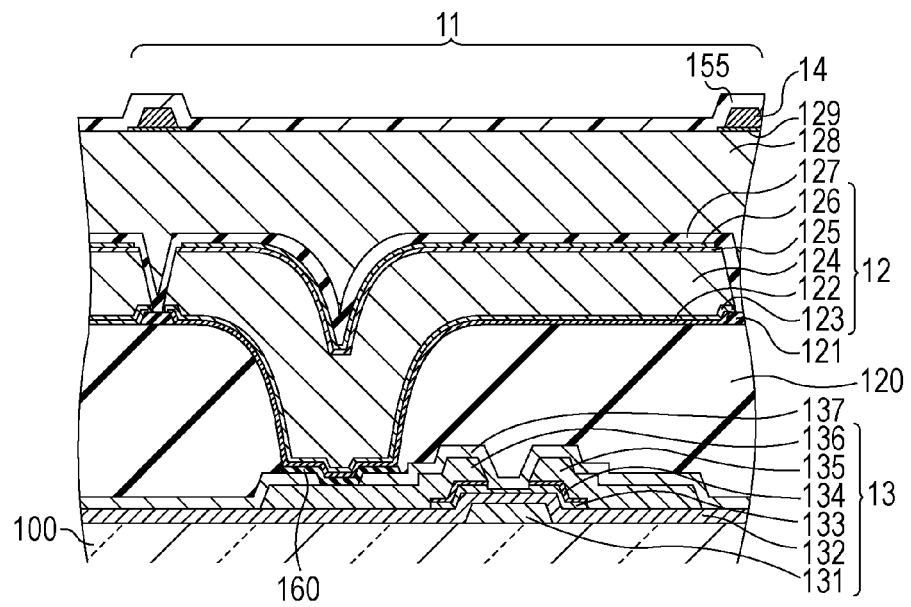
FIG. 19 is a sectional view, per pixel, of a detection device according to an eighth embodiment.

The structure of one pixel in a detection device according to an eighth embodiment will be described below with reference to FIG. 19. FIG. 19 is a sectional view taken along a line corresponding to the line A-A' in FIG. 17A.

In the eighth embodiment, the coating layer 160 is disposed between the protection layer 137 and the interlayer insulating layer 120. Such an arrangement may also inhibit the protection layer 137 from being exposed to the etchant in the operation of forming the insulating member 121 by etching, and may protect the protection layer 137 against the etchant in the operation of forming the insulating member 121 by etching.

Figure 20A:
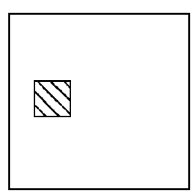
FIGS. 20A, 20C and 20E illustrate mask patterns to explain a method of manufacturing the detection device according to the eighth embodiment.
Figure 20B:
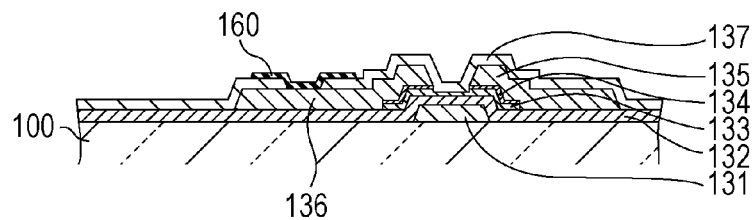
FIGS. 20B, 20D and 20F are sectional views to explain the method of manufacturing the detection device according to the eighth embodiment.
Figure 20C:
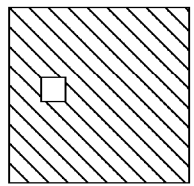
Figure 20D:
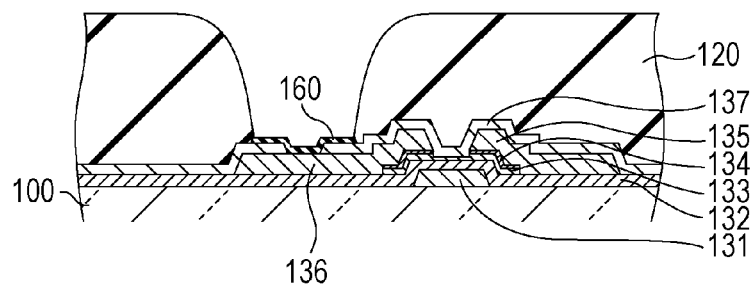
Figure 20E:
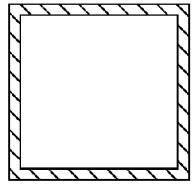
Figure 20F:
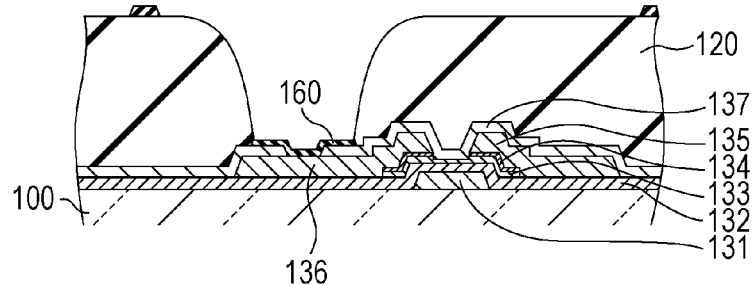

A method of manufacturing the detection device according to the eighth embodiment will be described below with reference to FIGS. 20A to 20F. In particular, operations subsequent to an operation of forming the coating layer 160 are described in detail with reference to mask patterns and sectional views during a process. FIGS. 20A, 20C and 20E are schematic plan views of mask patterns of photomasks used in successive operations. FIGS. 20B, 20D and 20F are schematic sectional views, taken at a position corresponding to the line A-A' in FIG. 17A, in the successive operations.

First, an electroconductive film similar to that used in the fifth and seventh embodiments is formed by sputtering to cover the protection layer 137. The electroconductive film is then subjected to wet etching by using a mask illustrated in FIG. 20A, thereby forming the coating layer 160.

Next, in an operation illustrated in FIG. 20D, an acryl resin as an organic material having photosensitivity is formed as an interlayer insulating film to cover the protection layer 137 and the coating layer 160 by using a coating apparatus, e.g., a spinner. A polyimide resin, for example, may also be used as the organic material having photosensitivity. By using a mask illustrated in FIG. 20C, the interlayer insulating layer 120 having the contact hole is then formed through exposure and development.

Next, in an operation illustrated in FIG. 20F, an insulating film made of a general inorganic material, e.g., a silicon nitride film or a silicon oxide film, is formed by plasma CVD to cover the interlayer insulating layer 120. The insulating film is then etched by using a mask illustrated in FIG. 20E, thereby forming the insulating member 121 between the pixels. In that etching operation, because the coating layer 160 is disposed between the protection layer 137 and the interlayer insulating layer 120, the protection layer 137 may be inhibited from being exposed to the etchant and the protection layer 137 may be protected against the etchant.

Operations subsequent to the operation of forming the insulating member 121 are similar to those described above in the seventh embodiment and detailed description of those operations is omitted. Thus, the surface of the interlayer insulating layer 120 is covered with the plurality of insulating members 121 and the plurality of first electrodes 122. Accordingly, when the impurity semiconductor layer 123 of first conductivity type, the semiconductor layer (amorphous silicon) 124, and the impurity semiconductor layer 125 of second conductivity type are formed, contamination of those layers by the organic material of the interlayer insulating layer 120 may be avoided.

While a part of the first electrode 122 is disposed on the insulating member 121 in this embodiment, a part of the first electrode 122 may be disposed under the insulating member 121 as described above in the second and fifth embodiments. In such a case, the operation of forming the first electrode 122 and the operation of forming the insulating member 121 are performed in reversed order.

Application Example

Figure 21:
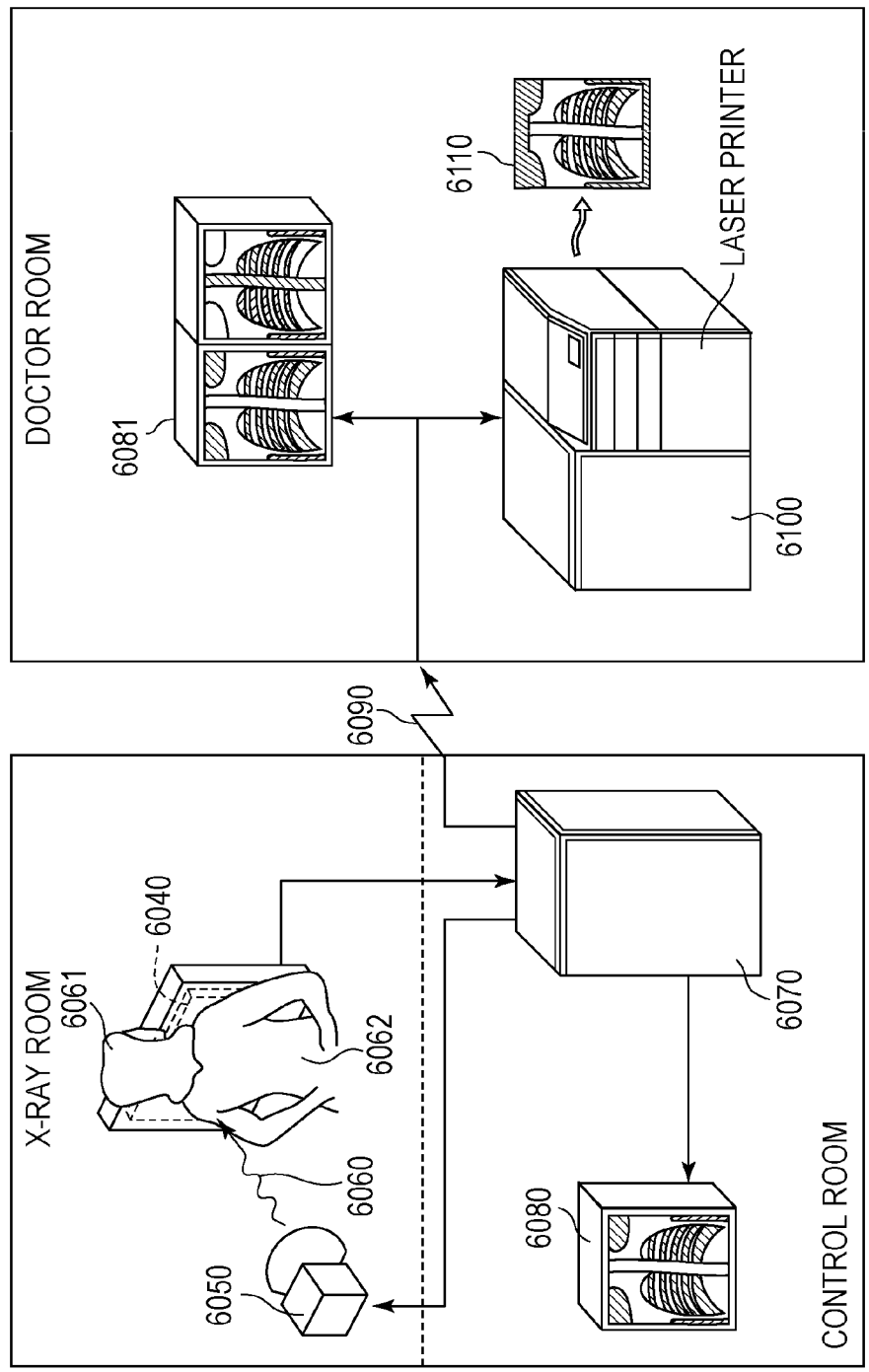
FIG. 21 is a conceptual view of a radiation detection system using the detection device according to one embodiment.

A radiation detection system using the detection device according to one embodiment will be described below with reference to FIG. 21.

An X-ray 6060 generated by an X-ray tube 6050, as a radiation source, passes through the chest 6062 of a patient or examinee 6061 and enters the conversion elements 12 in the conversion section 3 (see FIG. 3) that is included in a radiation detection device 6040. The X-ray incident on the conversion elements 12 includes information regarding the inside of the body of the patient 6061. Upon the incidence of the X-ray, the radiation is converted to electric charges in the conversion section 3, to thereby obtain electrical information. The electrical information is converted to digital data and is subjected to image processing in an image processor 6070, which is an example of a signal processing unit, such that the information may be observed on a display 6080, which is an example of a display unit, in a control room.

The obtained information may be transferred to a remote place through a transmission processing unit, e.g., a telephone line 6090, or may be displayed on a display 6081, which is another example of the display unit, or stored in a recording unit, e.g., an optical disk, in a doctor room, etc. at another location such that a doctor at the remote place or in the doctor room may make diagnosis. Alternatively, the obtained information may also be recorded on a film 6110 as a recording medium by a film processor 6100, which is another example of the recording unit.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-089550 filed Apr. 10, 2012 and No. 2011-122015 filed May 31, 2011 which are hereby incorporated by reference herein in their entirety.

What is claimed is:

1. A method of manufacturing a detection device including a plurality of pixels arrayed on a substrate, the pixels each including a switch element disposed on the substrate and a conversion element including an impurity semiconductor layer disposed on an electrode, which is disposed above the switch element and which is isolated per pixel, a protection layer made of an inorganic material, disposed between the substrate and the plurality of electrodes, and covering the plurality of switch elements, and an interlayer insulating layer made of an organic material and disposed over the protection layer, the switch element and the electrode being connected to each other in a contact hole that is formed in the protection layer and the interlayer insulating layer, the method comprising:

forming, on the interlayer insulating layer, the electrodes in contact with the interlayer insulating layer and insulating members each made of an inorganic material and disposed to cover the interlayer insulating layer between adjacent two of the electrodes;

forming an impurity semiconductor film that covers the insulating members and the electrodes, and that becomes the impurity semiconductor layer; and forming a coating layer such that, when the insulating members are formed, the coating layer covers an area of the protection layer where an orthographically-projected image of a portion of the electrode is positioned, the portion including a level difference located within the contact hole of the interlayer insulating layer.

2. The method of manufacturing the detection device according to claim 1, wherein forming the electrodes comprises forming an insulating film made of the inorganic material and covering the interlayer insulating layer, and forming the insulating members from the insulating film, and forming a transparent conductive oxide film that covers the interlayer insulating layer and the insulating members, and forming the electrodes from the transparent conductive oxide film, and forming the coating layer is performed after forming the protection layer and before forming the insulating members.

3. The method of manufacturing the detection device according to claim 2, wherein forming the coating layer is performed after forming the protection layer and before forming the interlayer insulating layer.

4. The method of manufacturing the detection device according to claim 2, wherein forming the coating layer is performed after forming the interlayer insulating layer and before forming the insulating members.

5. The method of manufacturing the detection device according to claim 2, wherein the coating layer is made of an inorganic insulating material and is formed such that the contact hole is kept open in the protection layer.

6. The method of manufacturing the detection device according to claim 2, wherein the coating layer is made of an electroconductive material and is formed in contact with the switch element and the electrode.

7. The method of manufacturing the detection device according to claim 1, wherein forming the electrodes comprises forming a transparent conductive oxide film that covers the interlayer insulating layer, and forming the electrodes from the transparent conductive oxide film, and forming an insulating film made of the inorganic material and covering the interlayer insulating layer and the electrodes, and forming the insulating members from the insulating film, and forming the coating layer is performed after forming the protection layer and before forming the insulating members.

8. The method of manufacturing the detection device according to claim 7, wherein forming the coating layer is performed after forming the protection layer and before forming the interlayer insulating layer.

9. The method of manufacturing the detection device according to claim 7, wherein forming the coating layer is performed after forming the interlayer insulating layer and before forming the insulating members.

10. The method of manufacturing the detection device according to claim 7, wherein the coating layer is made of an inorganic insulating material and is formed such that the contact hole is kept open in the protection layer.

11. The method of manufacturing the detection device according to claim 7, wherein the coating layer is made of an electroconductive material and is formed in contact with the switch element and the electrode.

12. The method of manufacturing the detection device according to claim 1, wherein the coating layer is formed simultaneously with the insulating member by using the inorganic material that forms the insulating member.

13. The method of manufacturing the detection device according to claim 1, further comprising removing a part of the impurity semiconductor film above the insulating member, thereby forming the impurity semiconductor layer.

14. The method of manufacturing the detection device according to claim 13, wherein forming an impurity semiconductor film includes forming a semiconductor film that covers the impurity semiconductor film.

15. The method of manufacturing the detection device according to claim 14, wherein removing a part of the impurity semiconductor film comprises removing a part of the impurity semiconductor film and a part of the semiconductor film above the insulating member, thereby forming the impurity semiconductor layer from the impurity semiconductor film and a semiconductor layer of the conversion element from the semiconductor film, respectively.

16. The method of manufacturing the detection device according to claim 13, wherein removing a part of the impurity semiconductor film further includes forming a semiconductor film that covers the impurity semiconductor layer.

17. The method of manufacturing the detection device according to claim 16, wherein removing a part of the impurity semiconductor film comprises removing the impurity semiconductor film and the semiconductor film above the insulating member, thereby forming the impurity semiconductor layer from the impurity semiconductor film and a semiconductor layer of the conversion element from the semiconductor film, respectively.

18. The method of manufacturing the detection device according to claim 17, further comprising:

forming an impurity semiconductor film having a conductivity type different from that of the aforesaid impurity semiconductor film and covering the semiconductor film;

forming an electroconductive film covering the impurity semiconductor film of the different conductivity type and becoming an opposite electrode, different from the aforesaid electrode, of the conversion element; and forming an electrode wiring, which is connected to the electroconductive film, at a position where an orthographically-projected image of the electrode wiring overlaps with the insulating member.

* * * * *